United States Patent
Wada et al.

(10) Patent No.: US 8,273,630 B2
(45) Date of Patent: Sep. 25, 2012

(54) METHOD FOR MANUFACTURING SEMICONDUCTOR DEVICE

(75) Inventors: Takayuki Wada, Kawasaki (JP); Masanori Terahara, Kawasaki (JP); Junji Oh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/238,336

(22) Filed: Sep. 21, 2011

(65) Prior Publication Data

US 2012/0009752 A1   Jan. 12, 2012

Related U.S. Application Data

(62) Division of application No. 12/468,265, filed on May 19, 2009, now Pat. No. 8,043,917.

(30) Foreign Application Priority Data

Jun. 23, 2008   (JP) ................................. 2008-163797

(51) Int. Cl.
*H01L 21/761* (2006.01)
(52) U.S. Cl. ................... 438/296; 257/E21.546
(58) Field of Classification Search .......... 438/296, 438/264; 257/E21.546, E21.409
See application file for complete search history.

(56) References Cited

U.S. PATENT DOCUMENTS

| 5,696,386 | A  * | 12/1997 | Yamazaki ........................ 257/57 |
| 6,054,355 | A  * | 4/2000  | Inumiya et al. ............... 438/296 |
| 6,429,484 | B1 * | 8/2002  | Yu ................................... 257/347 |
| 6,525,402 | B1   | 2/2003  | Matsumoto et al. |
| 6,767,782 | B2   | 7/2004  | Saikawa et al. |
| 6,809,334 | B2 * | 10/2004 | Yamada ........................... 257/59 |
| 2004/0058499 | A1 * | 3/2004 | Ishitsuka et al. ............... 438/296 |
| 2005/0037582 | A1 * | 2/2005 | Dennard et al. .............. 438/281 |
| 2007/0269949 | A1 | 11/2007 | Sumino et al. |
| 2009/0256173 | A1 | 10/2009 | Chen et al. |

FOREIGN PATENT DOCUMENTS

| JP | 2000-091175 A | 3/2000 |
| JP | 2002-299587 A | 10/2002 |
| JP | 2002-334927 A | 11/2002 |

* cited by examiner

*Primary Examiner* — Thao P. Le
(74) *Attorney, Agent, or Firm* — Westerman, Hattori, Daniels & Adrian, LLP

(57) ABSTRACT

A method for manufacturing a semiconductor device includes forming a silicon substrate having first and second surfaces, the silicon substrate including no oxide film or an oxide film having a thickness no greater than 100 nm, forming a first oxide film at least on the second surface of the silicon substrate, forming a first film by covering at least the first surface, forming a mask pattern on the first surface by patterning the first film, forming a device separating region on the first surface by using the mask pattern as a mask, forming a gate insulating film on the first surface, forming a gate electrode on the first surface via the gate insulating film, forming a source and a drain one on each side of the gate electrode, and forming a wiring layer on the silicon substrate while maintaining the first oxide film on the second surface.

15 Claims, 44 Drawing Sheets

1.7676  1.8035

Δ ≅ 0.04

1.5509  1.6422

Δ ≅ 0.09

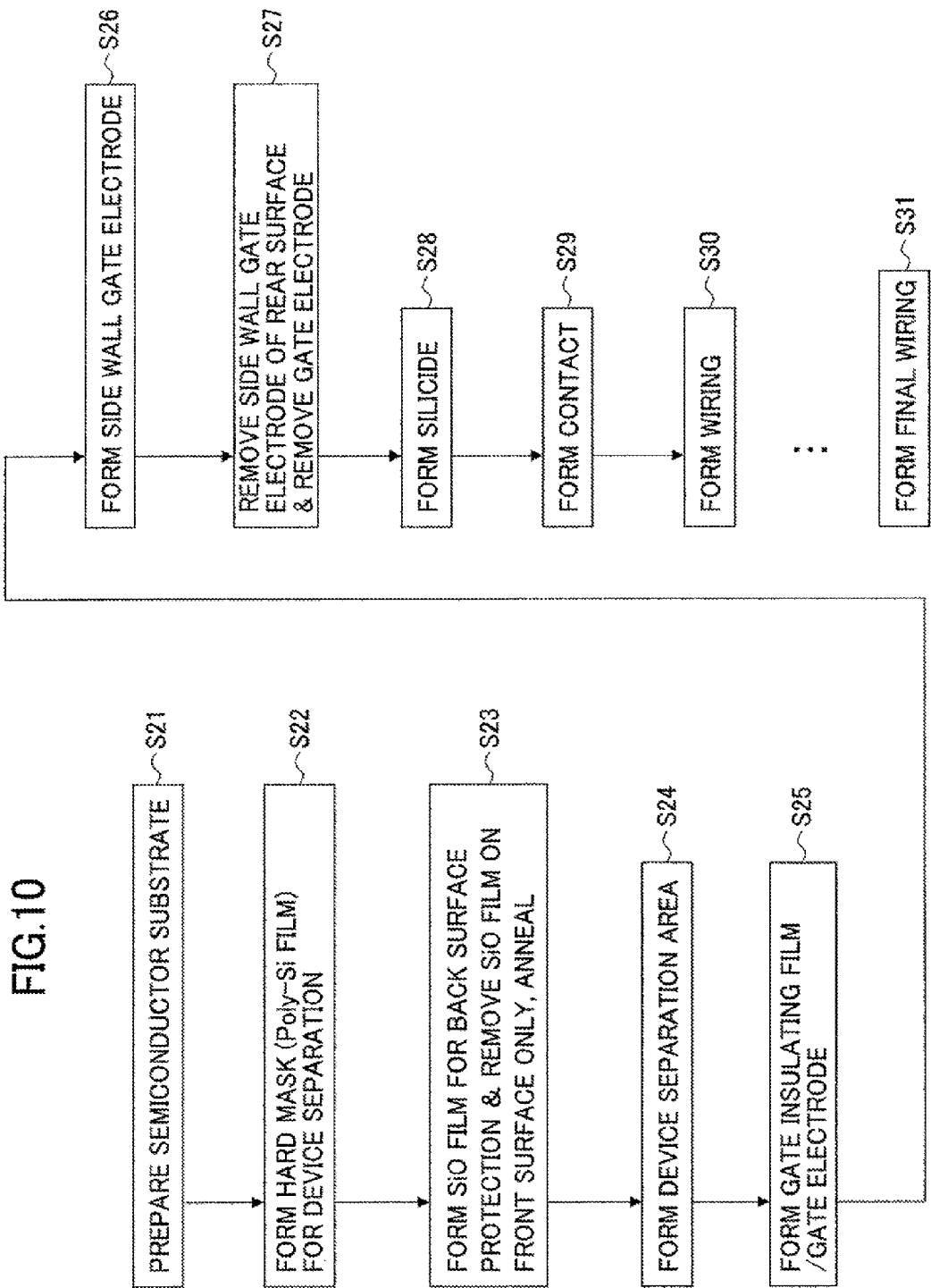

METHOD FOR MANUFACTURING SEMICONDUCTOR DEVICE

CROSS-REFERENCE TO RELATED APPLICATIONS

This application is a divisional application of U.S. application Ser. No. 12/468,265, filed May 19, 2009, based upon and claims the benefit of priority of the prior Japanese Patent Application No. 2008-163797 filed on Jun. 23, 2008, the entire contents of which are incorporated herein by reference.

FIELD

The embodiments discussed herein are generally related to a method for manufacturing a semiconductor device.

BACKGROUND

In producing semiconductor devices, a batch type method, which processes a large number of wafers simultaneously, is an effective method for improving productivity and is widely used.

The current batch type method is commonly performed by using a vertical furnace that performs a film forming process on numerous wafers that are horizontally set and spaced apart from each other in a vertical direction.

SUMMARY

According to aspects of an embodiment, a method for manufacturing a semiconductor device includes forming a silicon substrate having first and second surfaces, the silicon substrate including no oxide film or an oxide film having a thickness no greater than 100 nm, forming a first oxide film at least on the second surface of the silicon substrate, forming a first film by covering at least the first surface, forming a mask pattern on the first surface by patterning the first film, forming a device separating region on the first surface by using the mask pattern as a mask, forming a gate insulating film on the first surface, forming a gate electrode on the first surface via the gate insulating film, forming a source and a drain one on each side of the gate electrode, and forming a wiring layer on the silicon substrate while maintaining the first oxide film on the second surface.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

BRIEF DESCRIPTION OF DRAWINGS

FIG. 10 is a flowchart illustrating processes (including the steps illustrated with FIGS. 9A-9W) in the semiconductor device manufacturing method according to the second embodiment.

DESCRIPTION OF EMBODIMENTS

In the following, embodiments of the present invention will be described with reference to the accompanying drawings.

In a process for manufacturing a semiconductor device, a silicon wafer having its back surface protected with a silicon nitride film is used, and various processes are performed on a front surface of the silicon wafer. For example, in a case where a copper (Cu) layer is formed in a process of fabricating copper wiring, Cu atoms can be prevented from dispersing from the back side of the silicon wafer to the front side (device fabricating side) of the silicon wafer, so that characteristics of the device can be prevented from being affected by the Cu atoms.

This problem in depositing a gate insulating film is serious for an ultra-fine size ultra-high speed semiconductor device having a gate length less than 60 nm and a gate insulating film with a thickness less than 2 nm.

According to the below-described embodiments, in processing a substrate, the back side of a silicon wafer can be protected by an oxide film from the beginning to the end of the below-described method for manufacturing a semiconductor device. Thereby, a semiconductor device can be manufactured on each silicon wafer without being affected by a semiconductor device being manufactured on another silicon wafer. For example, a gate insulating film can be formed with a desired thickness. Moreover, the gate insulating film can be more evenly formed in the in-plane direction. Further, de-chucking failure (tending to occur when the back surface of the silicon wafer is covered by a nitride film) can be prevented because the back surface of the silicon wafer is covered by the oxide film.

First Embodiment

Figure 1:
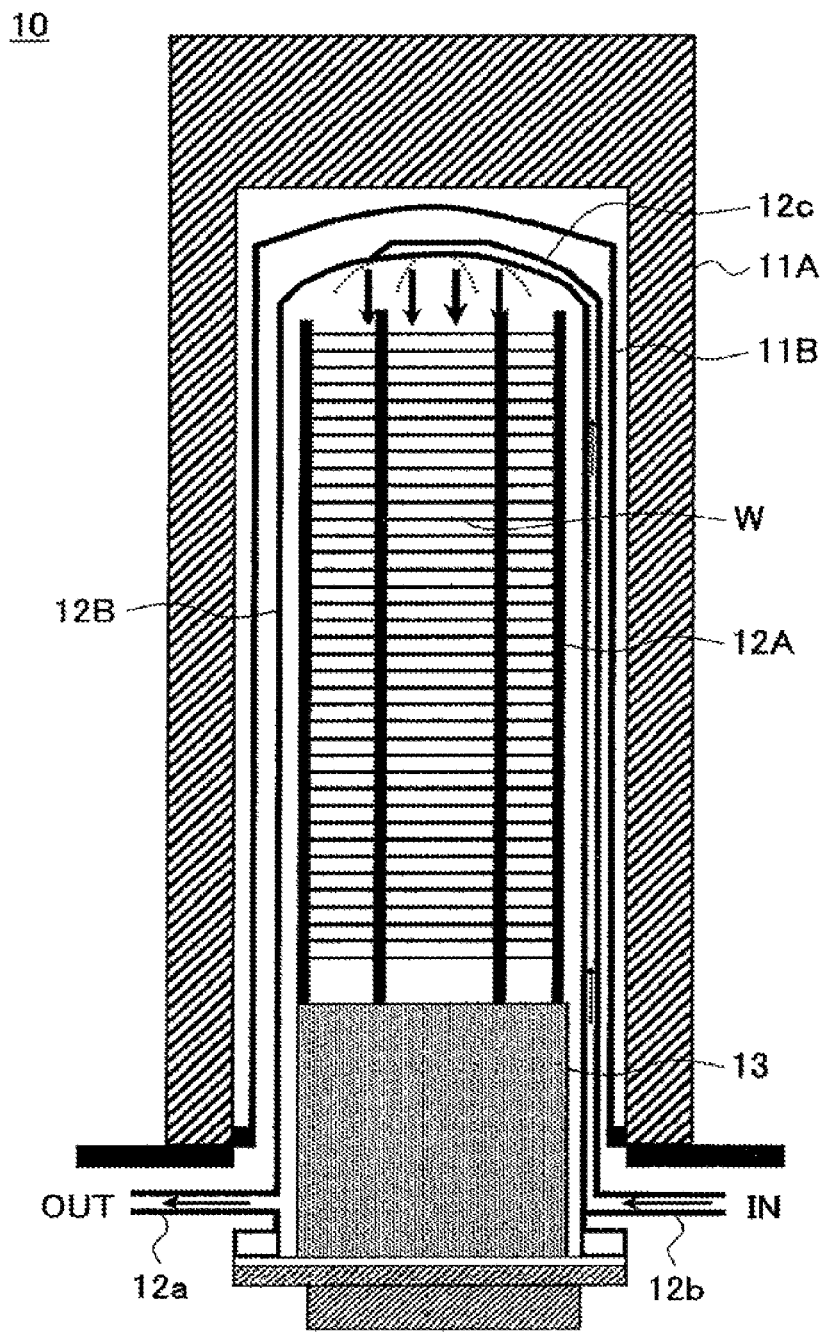
FIG. 1 is a schematic diagram illustrating a vertical furnace 10 used for a thermal oxidation process according to a first embodiment.

FIG. 1 is a schematic diagram illustrating a vertical furnace 10 used for a thermal oxidation process according to a first embodiment.

With reference to FIG. 1, the vertical furnace 10 includes a reactor 12B inserted into a container 11B being surrounded by a heater 11A. The reactor 12B has a closed tip part. Further, the reactor 12B formed of a quartz tube having an inner diameter of approximately 330 mm. A heat insulating tube 13 having a quartz board 12A formed thereon is inserted into the reactor 12B. Multiple silicon wafers W are horizontally placed on the quartz board 12A and stacked in a direction orthogonal to the horizontal direction at intervals of approximately 5-8 mm.

An exhaust port 12a is formed in the reactor 12B for releasing gas from inside the reactor 12B. Further, a gas intake port 12b is formed in the reactor 12B for supplying, for example, oxidizing gas (e.g., oxygen gas) used in a thermal oxidization process. Further, the gas intake port 12b may introduce source gases such as oxygen gas and TEOS (Tetra-Ethyl-Ortho-Silicate) used in a process for depositing a silicon oxide film by using a CVD method. Further, the gas intake port 12b may also introduce source gases such as silane ($SiH_4$) gas or silicon tetrachloride $SiCl_4$ gas along with a carrier gas or a suitable reactant gas where necessary.

The process gases (e.g., oxidizing gas, source gas) introduced from the gas intake port 12b flows through a quartz line 12c extending along an outer periphery of the reactor 12B and is guided into a processing space inside the reactor 12B from the tip part of the reactor 12B, that is, a gas introducing port (not illustrated) formed at a peak part of the reactor 12B.

Next, a method of manufacturing a semiconductor device according to the first embodiment is described with reference to FIGS. 2A-2V.

Figure 2A:
FIGS. 2A-2W are schematic diagrams for describing the processes in a semiconductor device manufacturing method according to the first embodiment.

With reference to FIG. 2A, a silicon wafer 21 having a diameter of, for example, 300 mm is prepared and is placed inside a first vertical furnace having substantially the same configuration as the vertical furnace 10. In this embodiment, plural silicon wafers 21 are placed inside the first vertical furnace at intervals of approximately 5-8 mm in a vertical direction. For example, the silicon wafer 21 used in this embodiment may have its front surface (upper surface) having an oxidized film (e.g., naturally oxidized film, or chemically oxidized film) entirely or partly removed by using e.g., a HydroFluoric (HF) process. In this case, the naturally oxidized film or other oxidized film may remain on other surfaces (sides) of the silicon wafer 21. In any case, the silicon wafer 21 in this embodiment is prepared including a front surface having an oxidized film with a film thickness no greater than 100 nm or prepared without any oxidized film. Thus, in a case where the silicon wafer is used as a silicon substrate, the silicon wafer may be prepared as is if the silicon wafer has a naturally oxidized film or a chemically oxidized film with a film thickness no greater than 100 nm.

Figure 2B:
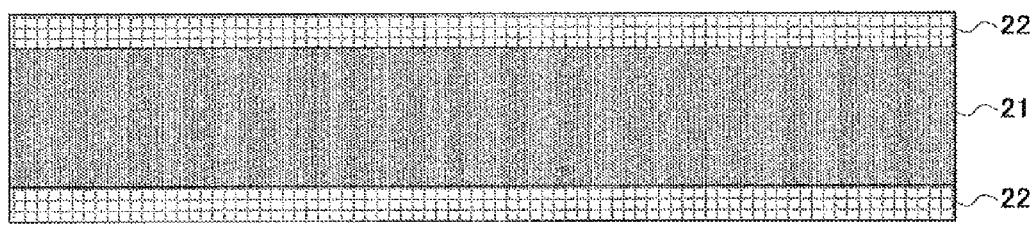

Then, the silicon wafer 21 is maintained with a substrate temperature of 900-1000° C. inside the first vertical furnace and is subjected to a thermal oxidation process in an oxygen gas atmosphere inside the first vertical furnace, so that a silicon oxide film 22 having a film thickness of 200 nm-400 nm is formed on the front surface (upper surface) and a rear surface of the silicon wafer 21 as illustrated in FIG. 2B. The silicon oxide films 22 illustrated in FIG. 2B may be formed by performing wet oxidization in the first vertical furnace. Alternatively, the silicon wafer 21 may be kept inside the first vertical furnace maintaining a substrate temperature of 500-600° C., and a TEOS gas (source gas) together with oxygen gas may be introduced into the reactor 12B, so that a silicon oxide film 22 having a film thickness no less than 200 nm can be formed on the front surface (upper surface) and a rear surface of the silicon wafer 21a as illustrated in FIG. 2B by performing a CVD method using the TEOS gas. As described above, the silicon wafer 21 is prepared having a silicon film no greater than 100 nm or without any silicon film.

Figure 2C:
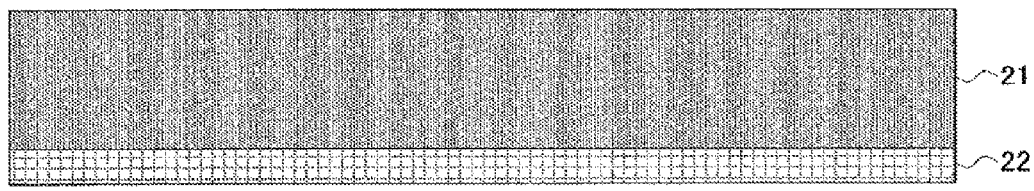

Then, as illustrated in FIG. 2C, the silicon wafer 21 is removed from the first vertical furnace and has the silicon oxide film 22 formed on its front surface removed by a single wafer type wet etching apparatus (not illustrated) using hydrofluoric acid (HF).

Figure 2D:
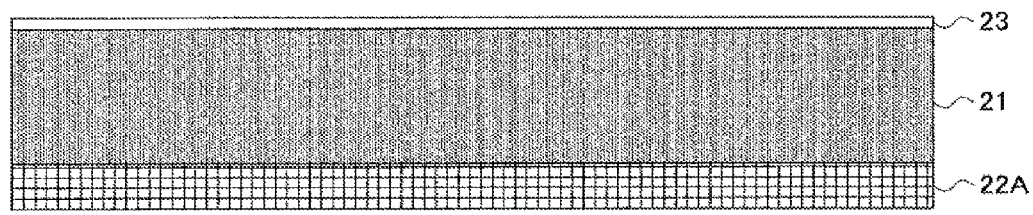

Then, the silicon wafer 21 is placed inside a second vertical furnace having substantially the same configuration as the vertical furnace 10 and is subject to a thermal oxidation process. Accordingly, as illustrated in FIG. 2D, a thermal oxide film 23 (which is to be a pad oxide film) having a film thickness of, for example, 10 nm is formed on an exposed front surface of the silicon wafer 21. In a case where the silicon oxide film 22 is formed by the CVD method, the thermal oxidation process performed on the silicon wafer 21 allows the silicon oxide film 22 formed on the back surface of the silicon wafer 21 to be thermally oxidized and transformed into a dense silicon oxide film 22A. In a case where the silicon oxide film 22 is a thermally oxidized film, there is no substantial change in the thickness or properties of the silicon oxide film 22. In the following description, the silicon oxide film 22 in FIG. 2D and the steps subsequent to the step on or after the step of FIG. 2D is indicated with a reference numeral 22A.

Figure 2E:
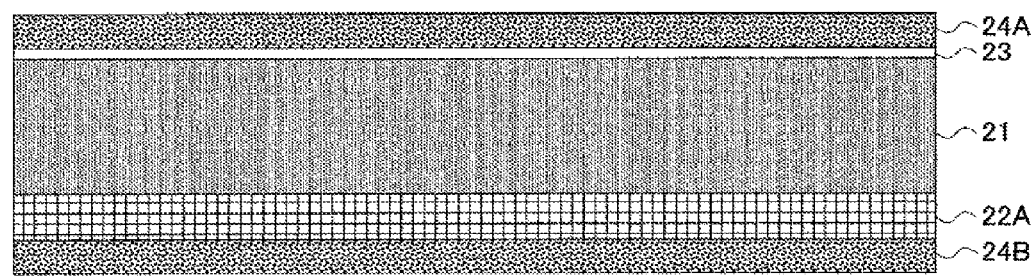

Then, the silicon wafer 21 is placed inside a third vertical furnace having substantially the same configuration as the vertical furnace 10 and a silicon source gas (e.g., silane gas) is supplied into the third vertical furnace, so that e.g., a poly-silicon film 24A is formed on the thermal oxide film 23 and another poly-silicon film 24B is formed on the silicon oxide film 22A as illustrated in FIG. 2E. Each of the poly-silicon films 24A, 24B has a film thickness of, for example, 100 nm.

Figure 2F:
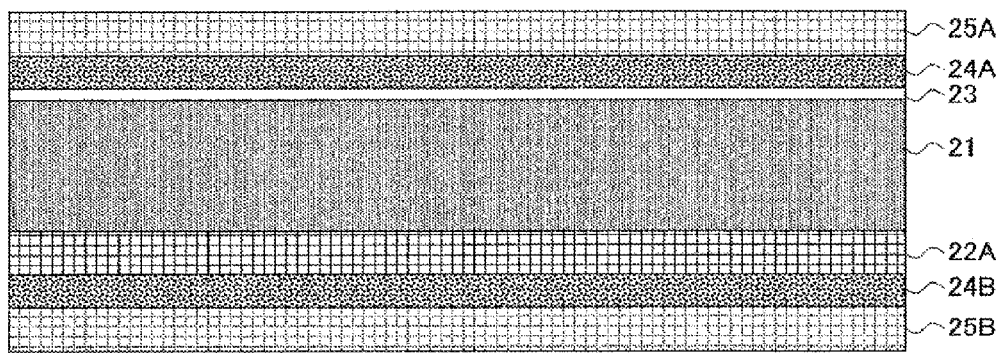

Then, the silicon wafer 21 is placed inside a fourth vertical furnace having substantially the same configuration as the vertical furnace 10 and a TEOS source gas and an oxygen gas are supplied together into the fourth vertical furnace. By performing a CVD method using the TEOS gas on the silicon wafer 21, a silicon oxide film 25B is formed on the poly-silicon film 24B formed on the back surface of the silicon wafer 21 as illustrated in FIG. 2F. Because the silicon oxide film 25B is later to be removed (etched) in the below-described process for forming a device separating structure, it is preferable to form the silicon wafer film 2 with a thickness (e.g., no less than 200 nm) in view of the etching amount in the device separating structure forming process when performing the CVD method on the silicon wafer 21. At the same time of forming the silicon oxide film 25B, a silicon oxide film 25A having the same thickness as the silicon oxide film 25B is formed on the poly-silicon film 24A formed on the front surface of the silicon wafer 21.

Figure 2G:
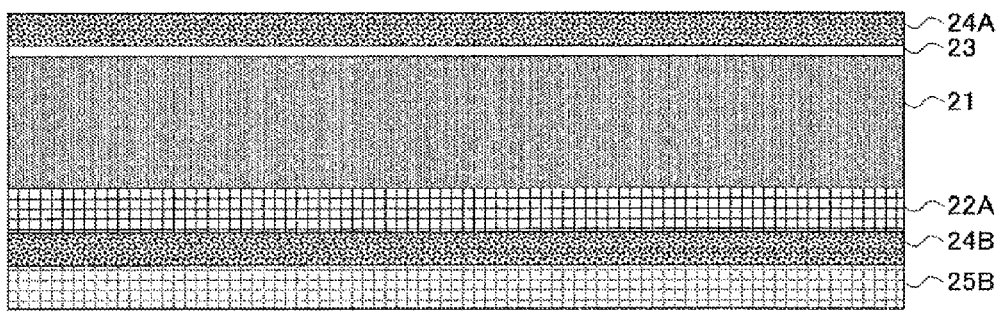

Then, as illustrated in FIG. 2G, the silicon wafer 21 is removed from the fourth vertical furnace and has the silicon oxide film 25A formed on its front surface removed by a single wafer type wet etching apparatus (not illustrated) using hydrofluoric acid (HF).

Figure 2H:
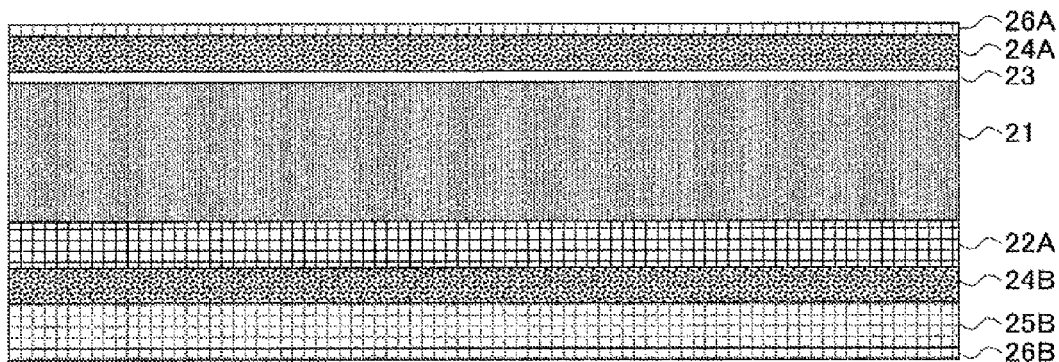

Then, the silicon wafer 21 is placed inside a fifth vertical furnace having substantially the same configuration as the vertical furnace 10, and a TEOS source gas and an oxygen gas are supplied together into the fifth vertical furnace. By performing a CVD method using the TEOS gas on the silicon wafer 21, silicon oxide films 26A, 26B are formed on corresponding poly-silicon films 24A, 24B formed on the front and back surface of the silicon wafer 21, as illustrated in FIG. 2H. Each silicon films 26A, 26B is formed with a thickness of, for example, 30 nm. The silicon oxide layer 26A formed on the poly-silicon film 24A acts as an anti-reflection film.

Figure 2I:
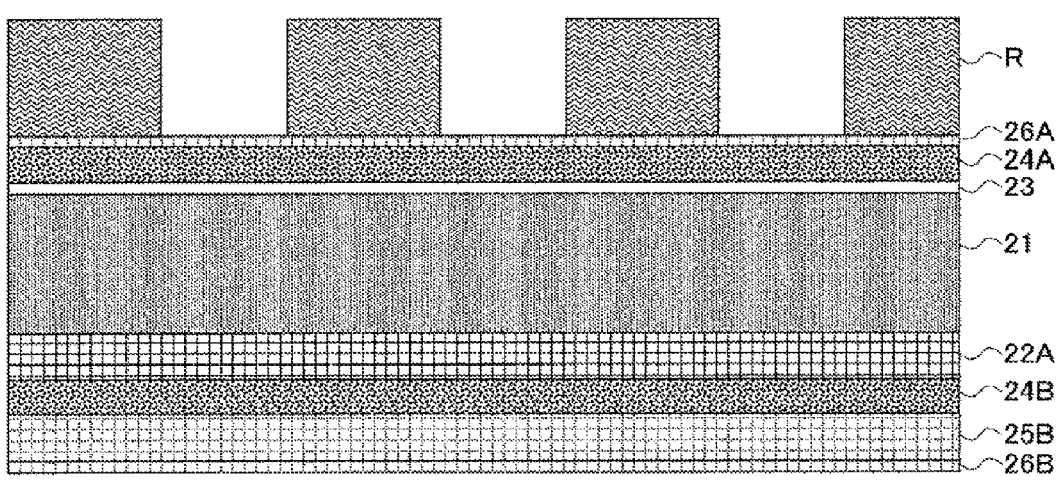

Then, as illustrated in FIG. 2I, a resist pattern R is formed on the silicon oxide layer (anti-reflection film) 26A on the front surface of the silicon wafer 21 for exposing predetermined device separating areas.

Figure 2J:
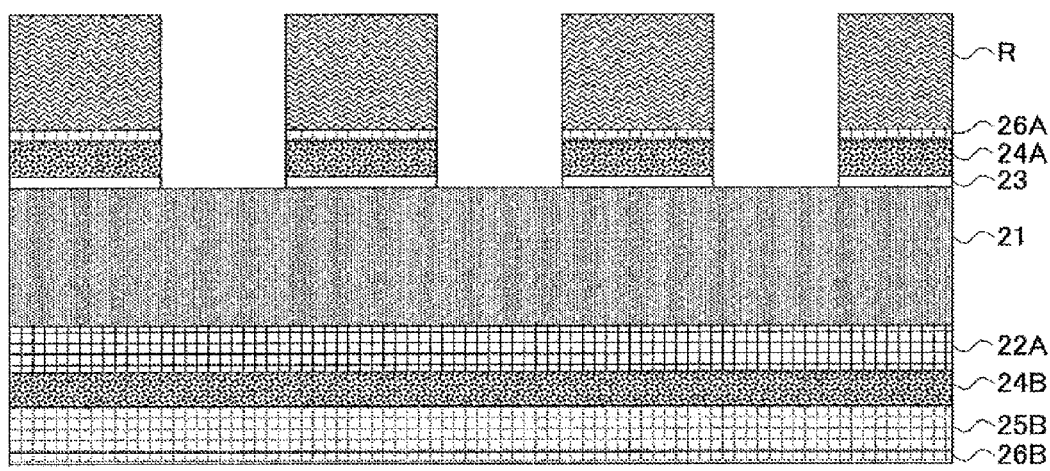

Then, as illustrated in FIG. 2J, the resist pattern R is used as a mask for dry-etching the anti-reflection film 26A, the poly-silicon film 24A, and the pad oxide film 23. Thereby, the silicon surface on the front surface of the silicon wafer 21 is exposed.

Figure 2K:
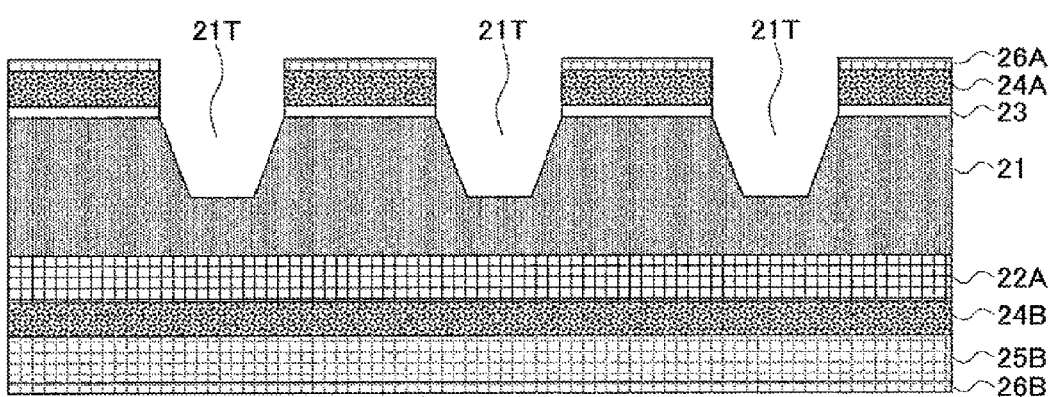

Then, as illustrated in FIG. 2K, the patterned poly-silicon film 24A is used as a mask for dry-etching the front surface of the silicon wafer 21. Thereby, a device separating groove(s) 21T is formed in the silicon wafer 21.

Figure 2L:
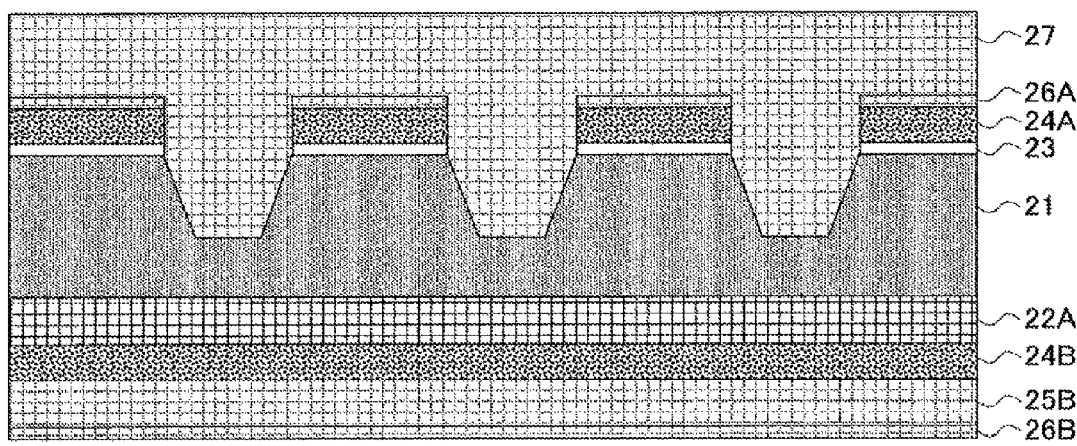

Then, as illustrated in FIG. 2L, a silicon oxide film 27 is formed on the front side of the structure illustrated in FIG. 2K by using a single wafer type plasma CVD apparatus (not illustrated) on the silicon wafer 21. By performing a high density plasma CVD method on the silicon wafer 21, the device separating grooves 21Y are filled by the silicon oxide film 27.

Figure 2M:
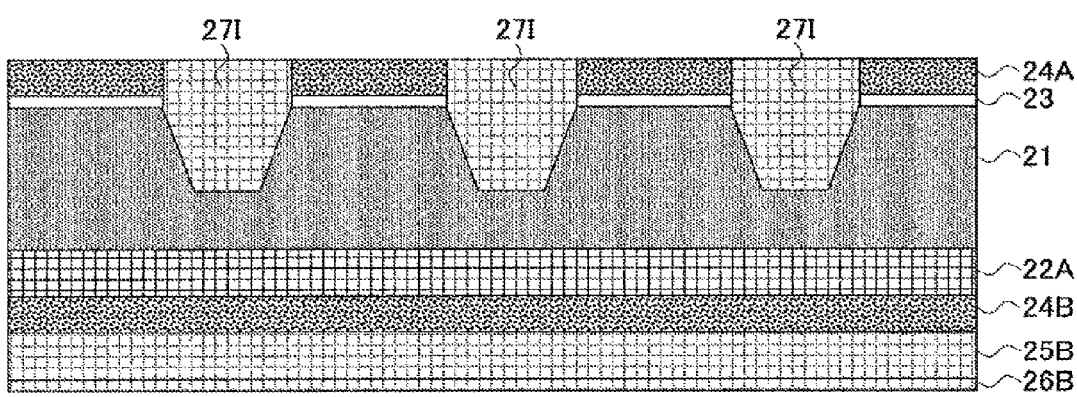

Then, as illustrated in FIG. 2M, the silicon wafer 21 is removed from the single wafer type plasma CVD apparatus and is subject to a chemical mechanical polishing process. The chemical mechanical polishing process is performed on the silicon wafer 21 until the poly-silicon film 24A provided below the silicon oxide film 27 is exposed. Thereby, a structure illustrated in FIG. 2M is obtained. The structure illustrated in FIG. 2M has each of its device separating grooves 21T filled by a device separating insulating film 27I.

Figure 2N:
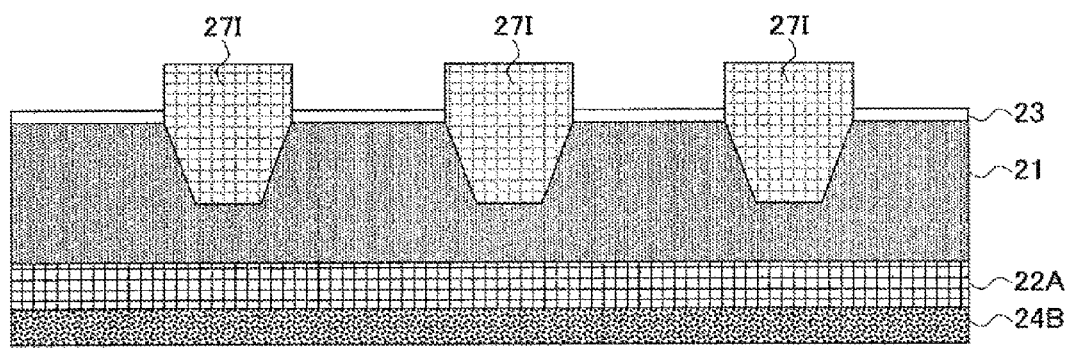

Then, as illustrated in FIG. 2N, the poly-silicon film 24A formed on the front surface of the silicon wafer 21 is removed by using, for example, a single wafer process type wet-etching apparatus. The wet-etching is performed by using, for example, an aqueous solution containing a mixture of HF and nitric acid ($HNO_3$). In the wet-etching process, the silicon oxide films 25B and 26B formed below the silicon wafer 21 are also affected by the wet-etching. However, as described above in the step illustrated in FIG. 2F, the silicon oxide film 25B is formed with a thickness no less than 200 nm. Accordingly, even where the wet-etching step illustrated in FIG. 2N is performed, the poly-silicon film 24B formed on the back surface of the silicon wafer 21 would not be exposed or removed. Thus, the silicon oxide film 22A can be protected from the poly-silicon film 24B.

Figure 2O:
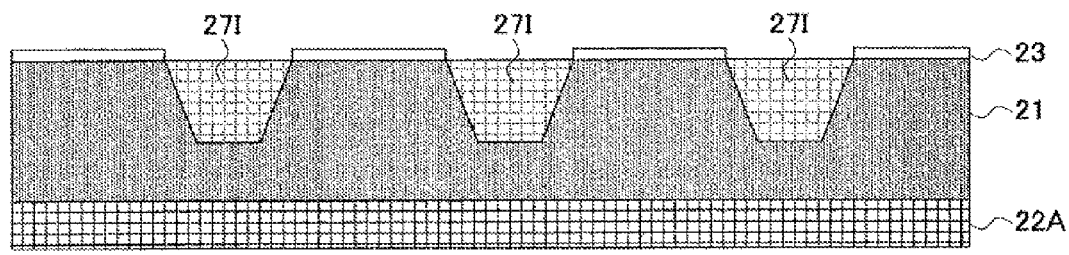

Then, as illustrated in FIG. 2O, the device separating insulating films 27I are flattened by performing a CMP (Chemical Mechanical Polishing) method and an HF process on the silicon wafer 21. In the step of FIG. 2O, the poly-silicon film 24B is removed with the silicon oxide film 22A remaining on the back surface of the silicon wafer 21 prior to a step of cleaning the front surface of the silicon wafer 21.

It is to be noted that, although the poly-silicon films 24A and 24B are utilized in performing the processes (steps) illustrated in FIGS. 2D-2P for forming a device separating structure, a single layer amorphous silicon film, a single layer silicon oxynitride film, a single layer silicon nitride film, a layered structure of a silicon nitride film and a silicon oxide film formed of TEOS, or a layered structure of a silicon nitride film, a poly-silicon or amorphous silicon film, and a silicon oxide film formed of TEOS may also be utilized.

Figure 2P:
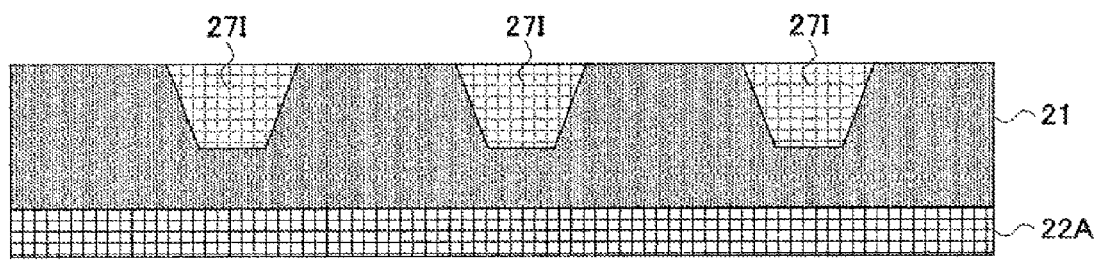

Then, as illustrated in FIG. 2P, the silicon oxide film 23 formed on the front surface of the silicon wafer 21 and other silicon oxide films (e.g., silicon oxide film 22A) is removed by using, for example, a single wafer type wet-etching apparatus, so that a fresh silicon surface is exposed at the front surface of the silicon wafer 21.

Then, the silicon wafer 21 having a configuration illustrated in FIG. 2P is placed inside a sixth vertical furnace having substantially the same configuration as the vertical furnace 10 and is maintained with a substrate temperature of 750-900° C. inside the sixth vertical furnace. Further, by guiding an oxygen gas at a flow rate of 10-20 sLm, a thermal oxide film 28 having a film thickness of approximately 1.8 nm is formed on the exposed upper surface (front surface) of the silicon wafer 21. The thermal oxide film 28 serves as a gate insulating film of a semiconductor device.

In forming the thermal oxide film 28, Si can be prevented from evaporating from the back surface of the silicon wafer 21 because the back surface of the silicon wafer 21 is covered by the silicon oxide layer 22A. Thus, evaporated Si can be prevented from adhering to parts (e.g., temperature sensor) of the sixth vertical furnace. As a result, temperature control or process control can be prevented from being adversely affected by the evaporated Si.

Figure 2Q:
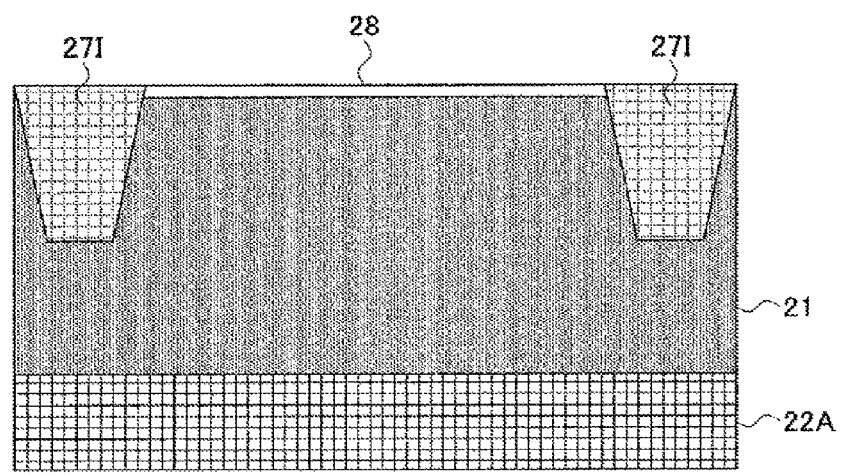
Figure 2R:
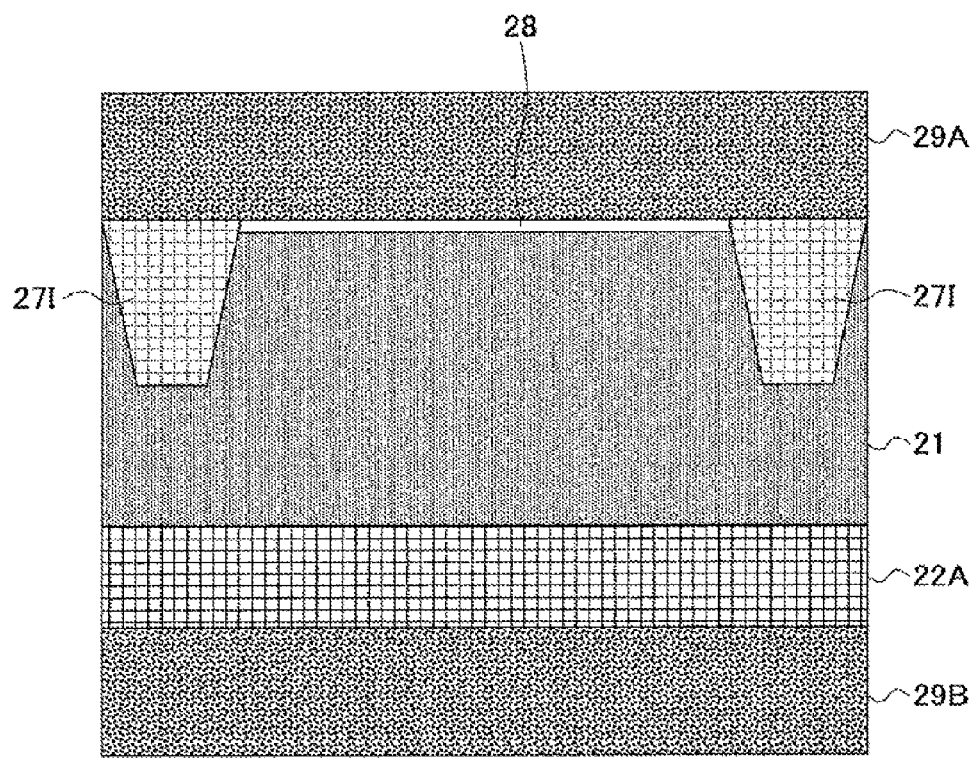

Then, the silicon wafer 21 having a configuration illustrated in FIG. 2Q is placed inside a seventh vertical furnace having substantially the same configuration as the vertical furnace 10. As illustrated in FIG. 2R, a poly-silicon film 29A having a film thickness of, for example, 105 nm is formed on the thermal oxide film 28 by using a CVD method. At the same time of forming the poly-silicon film 29A, a poly-silicon film 29B having the same film thickness as the poly-silicon film 29A is formed at the back surface of the silicon oxide film 22A.

Figure 2S:
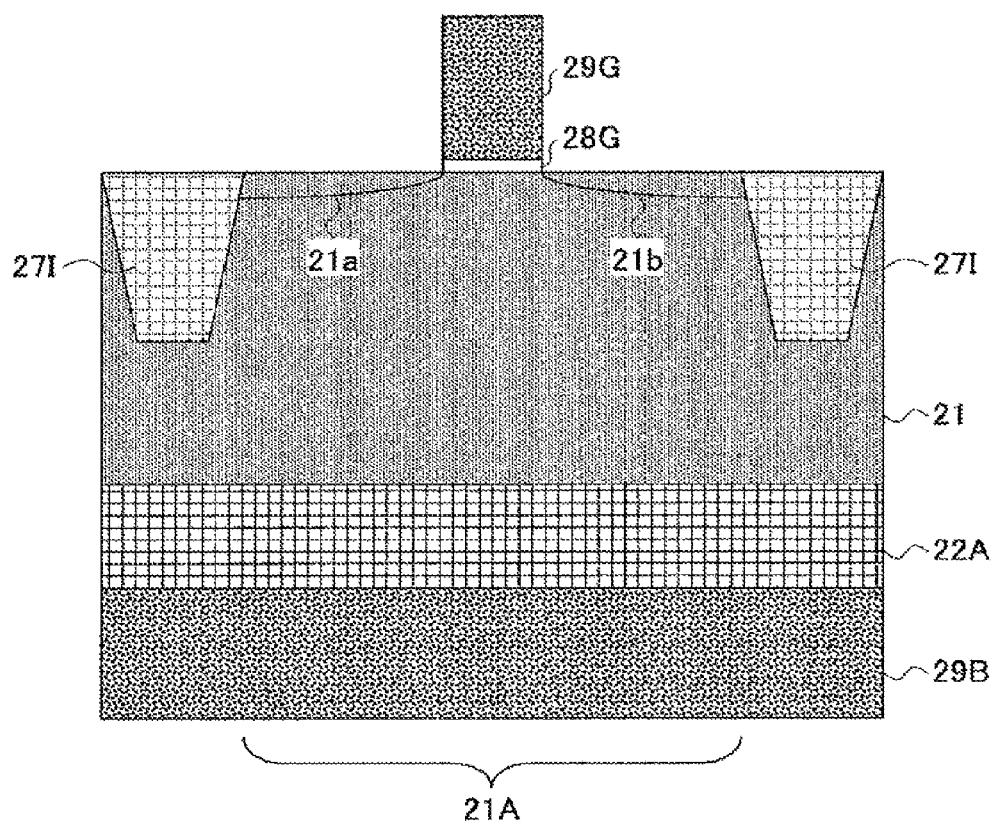

Then, the silicon wafer 21 having a configuration illustrated in FIG. 2R is removed from the seventh vertical furnace. Then, the poly-silicon film 29A and the thermal oxide film 28 provided below the poly-silicon film 29A are patterned by using resist on the silicon wafer 21. Thereby, a poly-silicon gate electrode 29G and a gate insulating film 28G are formed on the silicon wafer 21 as illustrated in FIG. 2S. Then, by using the poly-silicon gate electrode 29G as a mask, a p-type or n-type impurity element is implanted (ion implantation) into the silicon wafer 21. Thereby, diffusion regions 21a, 21b are formed in a device region 21A separated (delineated) by device separating regions 27I at the front surface of the silicon wafer 21. The diffusion regions 21a, 21b serve as LDDs (Lightly Doped Drains).

Then, the silicon wafer 21 having a configuration illustrated in FIG. 2S is placed inside an eighth vertical furnace having substantially the same configuration as the vertical furnace 10. By introducing ammonia ($NH_3$) and silane gas into the eighth vertical furnace and performing a CVD method on the front surface of the silicon wafer 21, a silicon nitride film 30A is formed in a manner covering the poly-silicon gate electrode 29G. At the same time of forming the silicon nitride film 30A, another silicon nitride film 30B is formed in a manner covering the back surface of the silicon wafer 21.

Figure 2T:
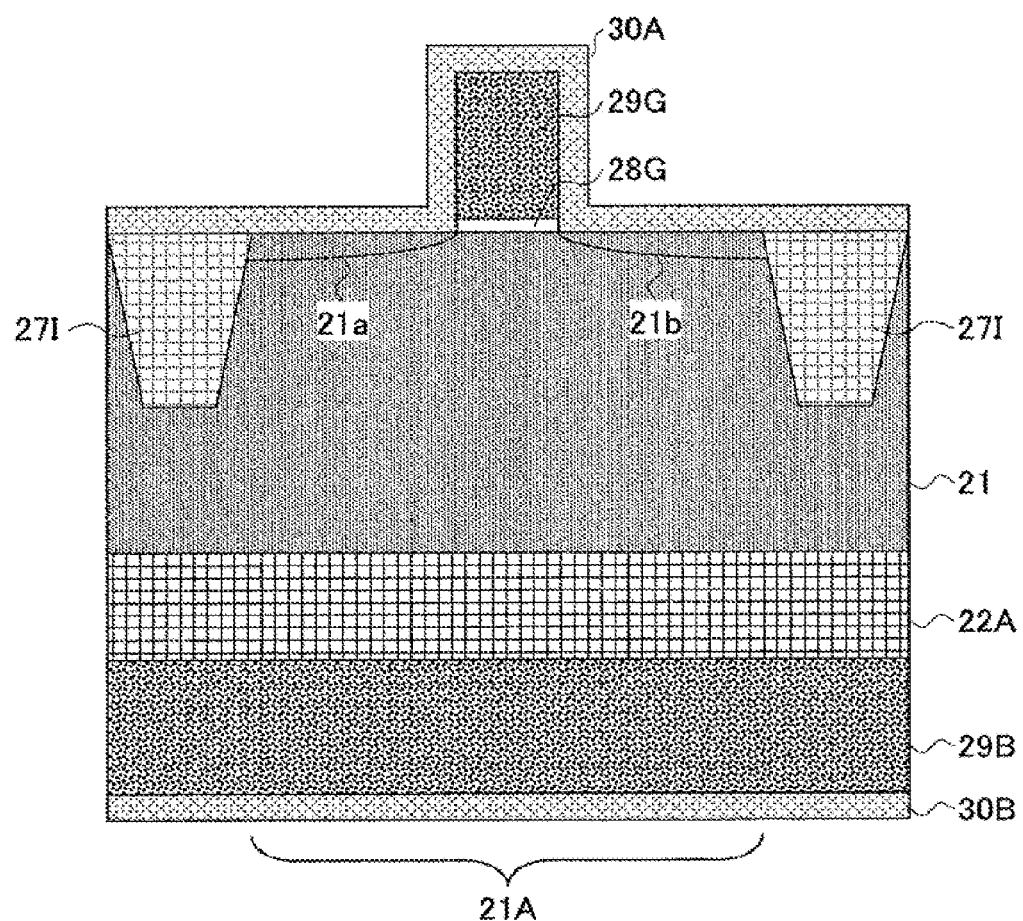

Then, the silicon wafer 21 having a configuration illustrated in FIG. 2T is removed from the eighth vertical furnace and is subject to an anisotropic etching with respect to a direction orthogonal to the front surface of the silicon wafer 21. Accordingly, the silicon nitride film 30A is etched-back, to thereby form a side wall insulating film 30W on both walls of the gate electrode 29G. Then, by using the gate electrode 29G and the side wall insulating film 30W as a mask, a p-type or n-type impurity element is implanted (ion implantation) into the silicon wafer 21. Thereby, diffusion regions 21c, 21d are formed in the device region 21A inside the silicon wafer 21. The diffusion regions 21c, 21d serve as a source region and a drain region at the outer sides of the side wall insulating film 30W.

Figure 2U:
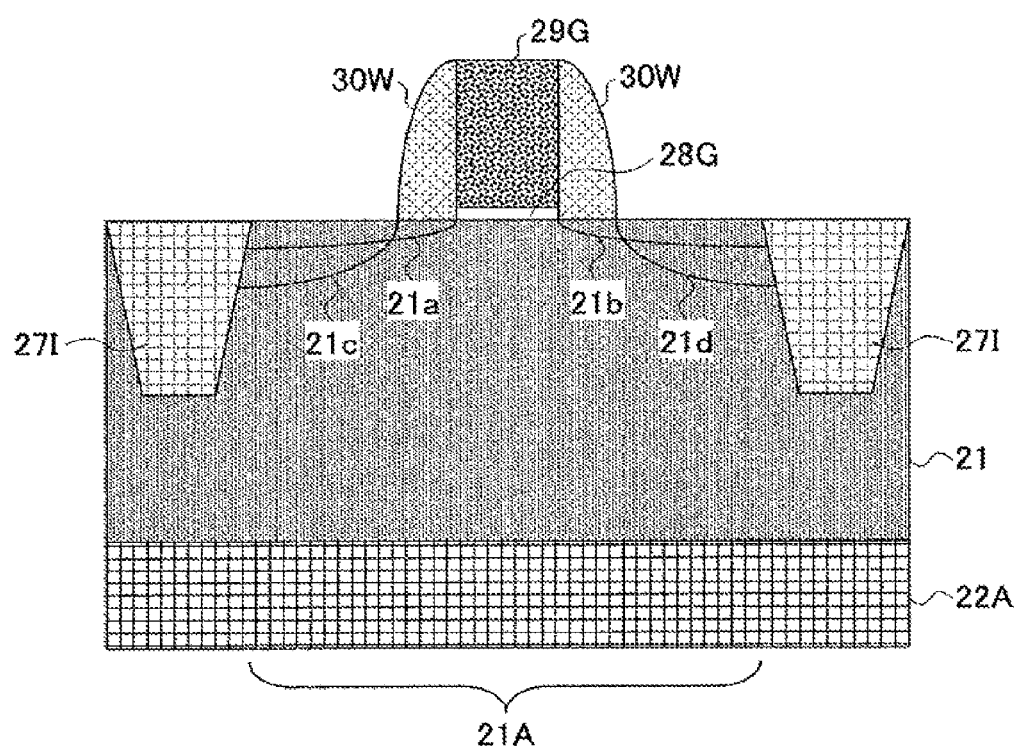

Then, in the step illustrated in FIG. 2U, the silicon nitride film 30B and the poly-silicon film 29B formed on the back surface of the silicon wafer 21 are removed. In this embodiment, the silicon nitride film 30B may be, e.g., dry-etched by using CHF etching gas and the poly-silicon film 29B is wet-etched by using an HF/HNO$_3$ etchant. Even in the state illustrated in FIG. 2U, the back surface of the silicon wafer 21 remain covered by the oxide film 22A.

Figure 2V:
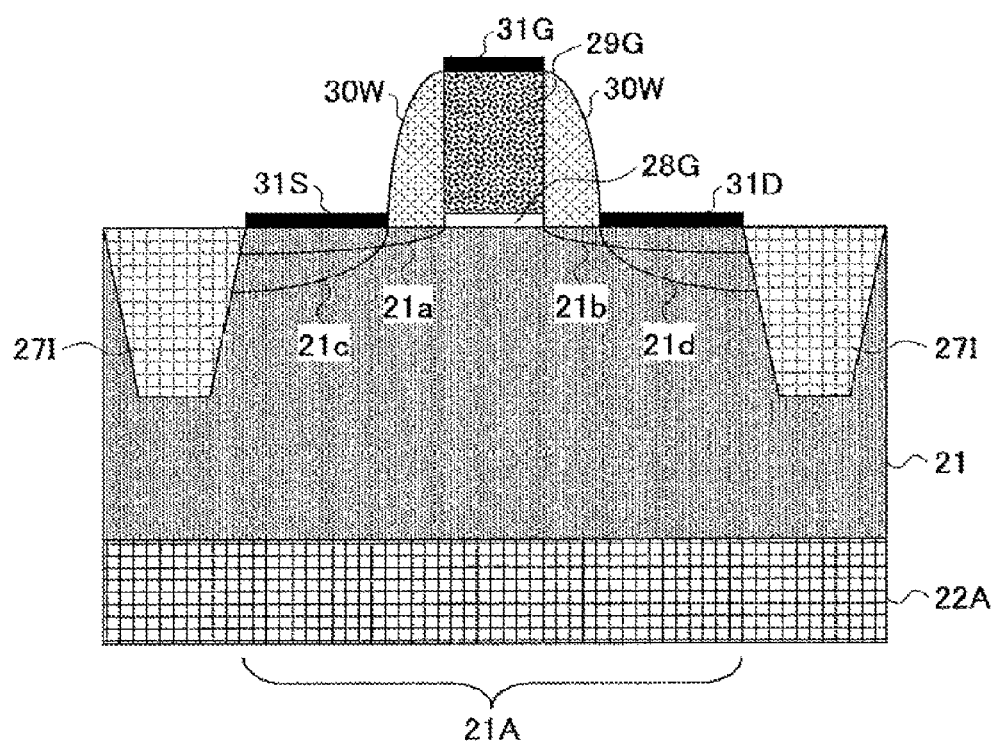

Then, as illustrated in FIG. 2V, silicide regions 31S, 31D, and 31G are formed on the corresponding diffusion regions 21c, 21d, and the gate electrode 29G by using, for example, a typical salicide method.

Figure 2W:
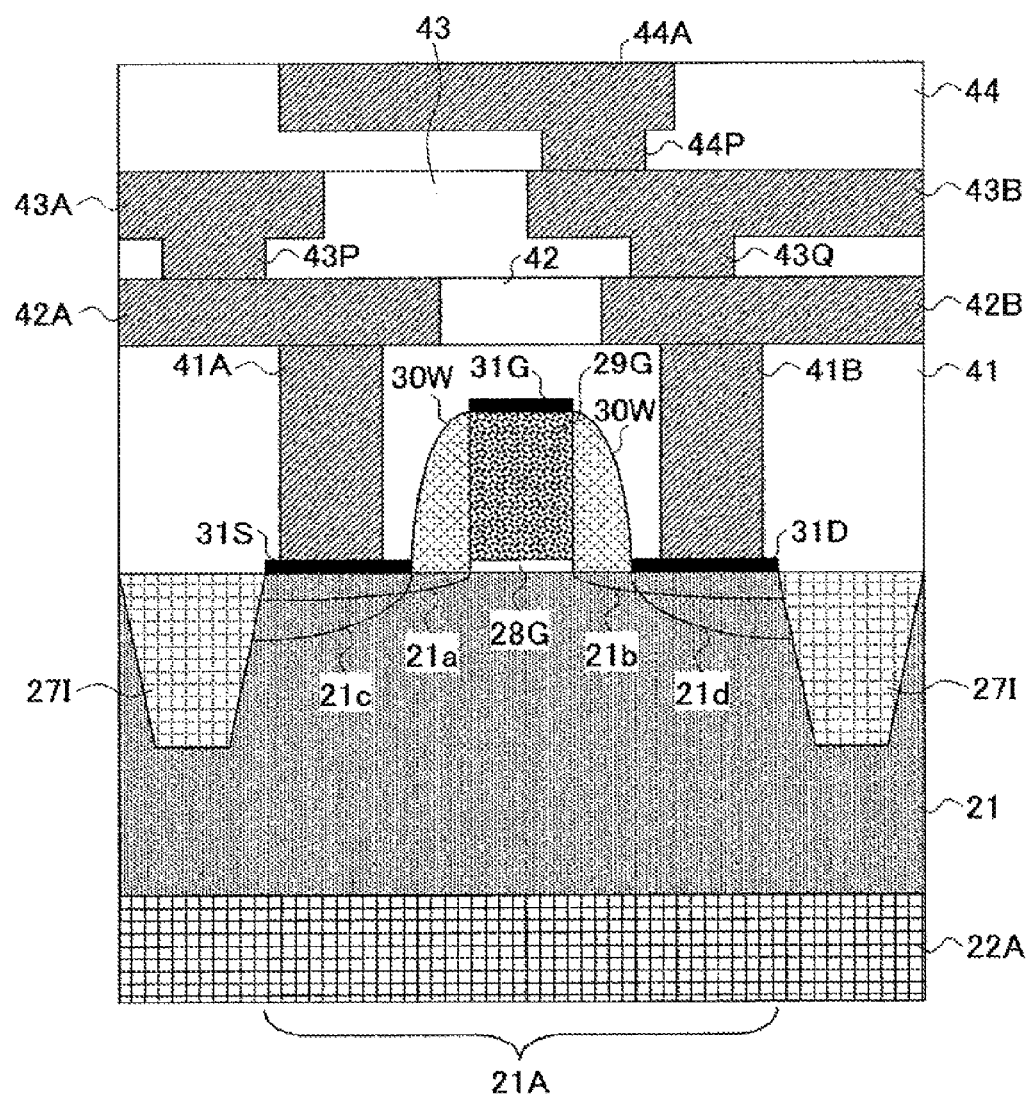

Then, as illustrated in FIG. 2W, an insulating film 41 is formed on the configuration illustrated in FIG. 2V in a manner covering the gate electrode 29G. Further, conductive plugs 41A, 41B (e.g., formed of tungsten (W)) that contact the silicide regions 31S, 31D are formed inside the insulating film 41.

Further, an interlayer insulating film 42 is formed on the insulating film 41. Further, copper (Cu) wiring patterns 42A, 42B that contact the conductive plugs 41A, 41B, respectively, are formed inside the interlayer insulating film 42 by using, for example, a damascene method.

Further, another interlayer insulating film 43 is formed on the insulating film 42. Further, a Cu wiring pattern 43A including a via plug 43P is formed inside the interlayer insulating film 43 and in contact with the Cu wiring pattern 42A by using, for example, a dual damascene method. Further, a Cu wiring pattern 42B including a via plug 43Q is formed inside the interlayer insulating film 43 and in contact with the Cu wiring pattern 42B by using, for example, a dual damascene method.

Further, another interlayer insulating film 44 is formed on the insulating film 43. Further, a Cu wiring pattern 44A including a via plug 44P is formed inside the interlayer insulating film 44 and in contact with the Cu wiring pattern 43B by using, for example, a dual damascene method.

Thus, the above-described interlayer insulating films 42-44, the Cu wiring patterns 42A, 42B, 43A, 43B, 44A, and the Cu via plugs 43P, 43Q, 44P form a multilayer wiring structure on the front surface of the silicon substrate 21.

Because the Cu wiring patterns and the Cu via plugs are formed by using an electrolytic plating method in forming the multilayer wiring structure, Cu atoms inside the plating liquid may accumulate in a case where the silicon surface of the back surface of the silicon wafer 21 of FIG. 2W is exposed. As a result, the accumulated Cu atoms may be dispersed to the front surface of the silicon substrate 21 in a subsequent process.

However, according to an embodiment, Cu atoms do not accumulate even when forming the multilayered wiring structure because the back surface of the silicon wafer 21 is covered by the silicon oxide film 22A.

It is to be noted that the above-described first-eighth vertical furnaces do not all need to be different furnaces. That is, a part of or all of the first-eighth furnaces may be the same.

Figure 3:
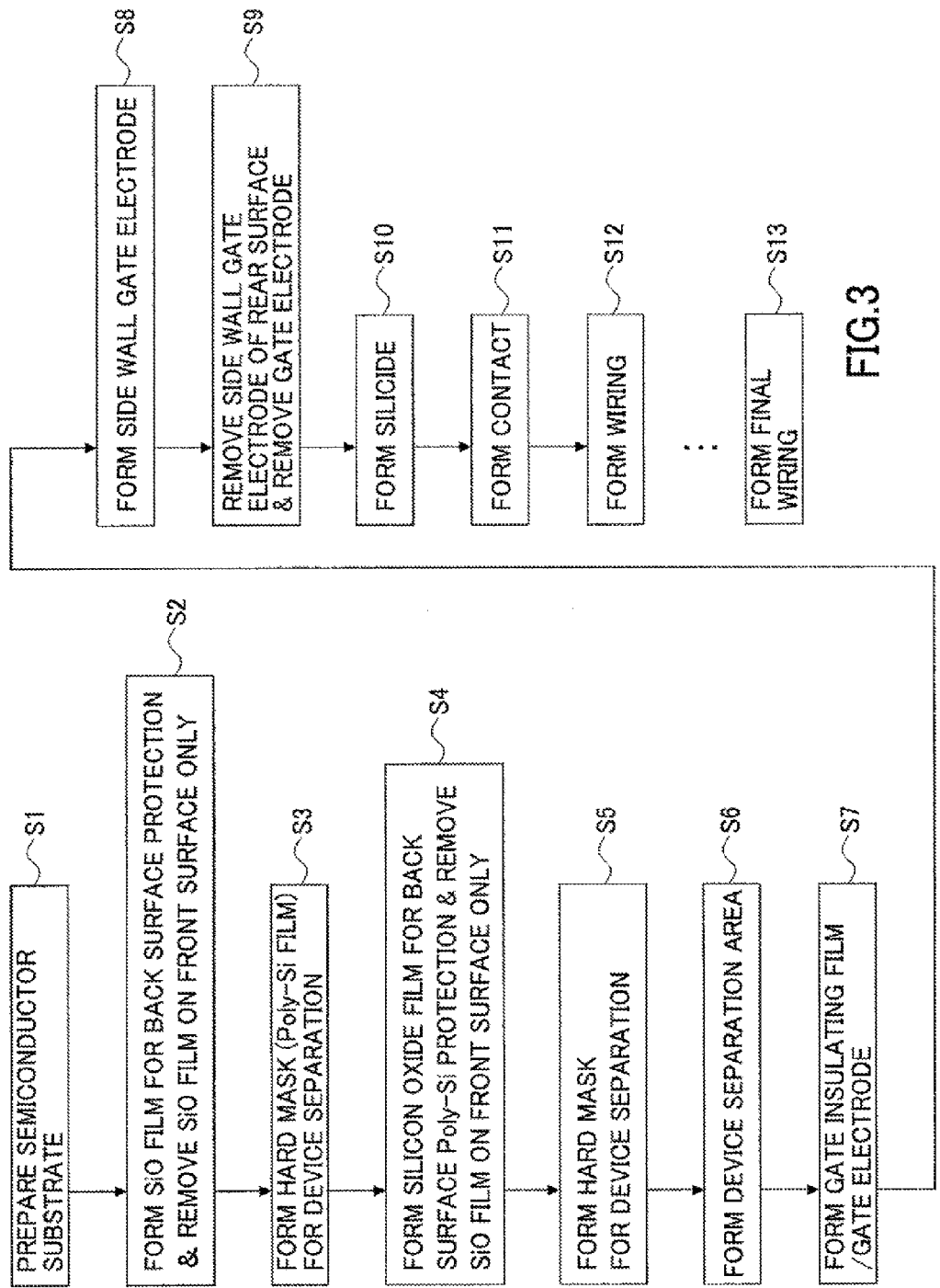
FIG. 3 is a flowchart illustrating processes (including the steps illustrated with FIGS. 2A-2W) in the semiconductor device manufacturing method according to the first embodiment.

FIG. 3 is a flowchart illustrating processes (including the steps illustrated with FIGS. 2A-2W) for manufacturing a semiconductor device according to the first embodiment.

With reference to FIG. 3, Step S1 corresponds to the process described with FIG. 2A where the silicon wafer 21 is prepared having no oxide film or having an oxide film with a film thickness no greater than 100 nm.

Step S2 corresponds to the processes described with FIGS. 2B and 2C where the silicon oxide film 22 is removed from the front surface of the silicon wafer 21 after forming the silicon oxide film 22 on the front and back surfaces of the silicon wafer 21.

Step S3 corresponds to the processes described with FIGS. 2D and 2E where the poly-silicon film 24A, which to be used as a hard mask in a subsequent process of forming a device separating structure, is formed along with forming another poly-silicon film 24B on the back surface of the silicon wafer 21.

Step S4 corresponds to the processes described with FIGS. 2F and 2G where the silicon oxide film 25B, which is for protecting the poly-silicon film 24B on the back surface of the silicon wafer 21, is formed substantially simultaneously with forming the silicon oxide film 25A on the front surface of the silicon wafer 21. Then, the silicon oxide film 25A is removed.

Step S5 corresponds to the processes described with FIGS. 2H through 2J where the poly-silicon wafer 24A is shaped (patterned) into a hard mask pattern corresponding to device separating regions.

Step S6 corresponds to the processes described with FIGS. 2J through 2P where device separating insulating regions (device separating insulating films) 27I are formed by filling the device separating grooves 21T formed on the front surface of the silicon wafer 21.

Step S7 corresponds to the processes described with FIGS. 2Q through 2S where the thermal oxide film 28, which is to be a gate insulating film, is formed on the front surface of the silicon wafer 21. Then, the gate electrode 29G is formed on the thermal oxide film 28. As described above, the back surface of the silicon wafer 21 is covered by the silicon oxide film 22A. Therefore, even in the step of forming the thermal oxide film 28, Si atoms can be prevented from evaporating from the exposed back surface of the silicon wafer 21. Thus, the vertical furnace used for forming the thermal oxide film 28 can control temperature without irregularity.

Steps S8 and S9 correspond to the processes described with FIGS. 2T and 2U. That is, the side wall insulating films 30W are formed on both side walls of the gate electrode 29G. Then, the silicon nitride film 30B and the poly-silicon film 29B formed on the back surface of the silicon wafer 21 are removed.

Step S10 corresponds to the process described with FIG. 2V where the silicide layers 31S, 31D, 31G are formed on corresponding front surfaces of the diffusion regions 21c, 21d, and the gate electrode 29G.

Step S11 corresponds to the processes of forming the insulating film 41 and the via plugs 41A, 41B as described with FIG. 2W.

Steps S12-S13 correspond to the process of forming the multilayer wiring structure as described with FIG. 2W.

Thus, as described above, with the semiconductor device manufacturing method according to an embodiment, the silicon oxide film 22A formed on the back surface of the silicon wafer 21 remains until the final Step S13. As a result, even in the process of forming the multilayer wiring structure including a Cu deposition step using an electrolytic-plating method, the back surface of the silicon wafer 21 can be prevented from being contaminated by Cu.

Further, according to this embodiment, the film which covers the back surface of the silicon wafer 21 from beginning to end of the semiconductor device manufacturing method is a silicon oxide film. Thus, unlike a nitride film, the silicon wafer 21 can be easily removed from an electrostatic chuck without being affected by residual charges.

Figure 4A:
FIGS. 4A-4T are schematic diagrams for describing the processes in a semiconductor device manufacturing method according to a comparative example.

Next, with reference to FIGS. 4A-4W, a method of manufacturing a silicon wafer 21 without a protective oxide film formed at its back surface is described as a comparative example with respect to the above-described embodiment. Although plural silicon wafers are actually processed in a batch by using a vertical furnace that is substantially the same as the furnace illustrated in FIG. 1, the below-described method describes manufacturing a single silicon wafer for the sake of convenience.

With reference to FIG. 4A, a silicon wafer 61 having a diameter of, for example, 300 mm is placed into a first vertical furnace having substantially the same configuration as the vertical furnace 10. Plural silicon wafers 61 are placed inside the first vertical furnace at intervals of approximately 5-8 mm in a vertical direction.

Figure 4B:
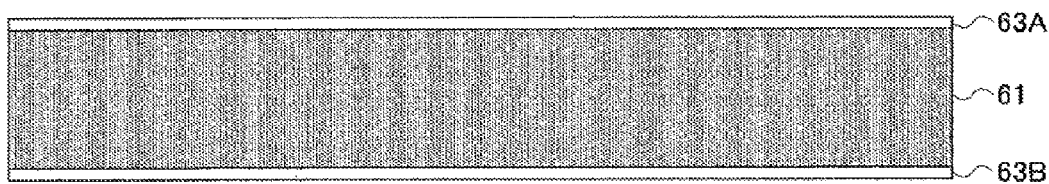

The silicon wafer 61 is maintained inside an oxygen gas atmosphere of the first vertical furnace and is subject to a thermal oxidation process. As illustrated in FIG. 4B, a thermal oxide film 63A (which is to be a pad oxide film) is formed on the exposed silicon of the front surface of the silicon wafer 61 while another thermal oxide film is formed on the back surface of the silicon wafer 61. In this example, the thermal oxide film 63A and 63B each have a film thickness of 10 nm.

Figure 4C:
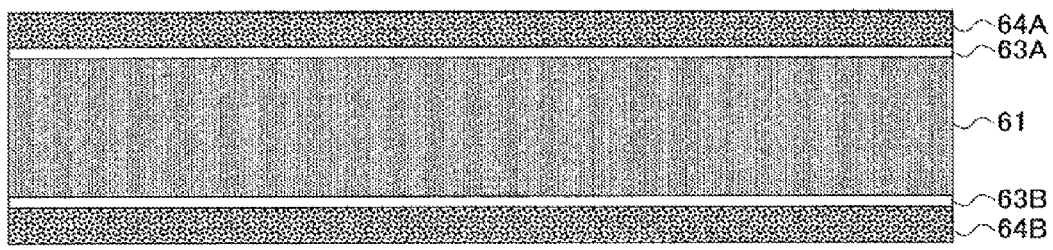

Then, the silicon wafer 61 is placed inside a second vertical furnace having substantially the same configuration as the vertical furnace 10 and a silicon source gas (e.g., silane gas) is supplied into the second vertical furnace with the same flow rate as the first embodiment, so that a poly-silicon film 64A is formed on the thermal oxide film 63A and another poly-silicon film 64B is formed on the thermal oxide film 63B as illustrated in FIG. 4C. Similar to the poly-silicon films 24A, 24B of the first embodiment, each of the poly-silicon films 64A, 64B has a film thickness of, for example, 100 nm.

Figure 4D:
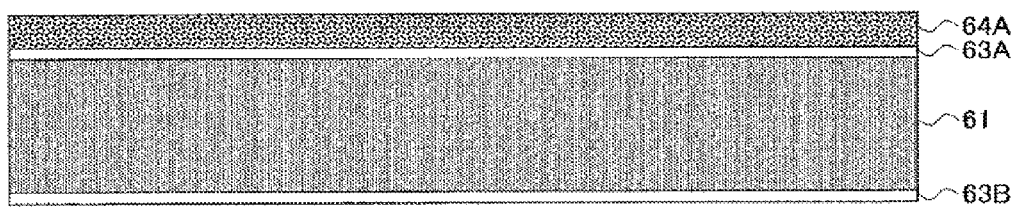

Then, as illustrated in FIG. 4D, the silicon wafer 61 is removed from the second vertical furnace and has the poly-silicon film 64B removed from its back surface by wet-etching.

Figure 4E:
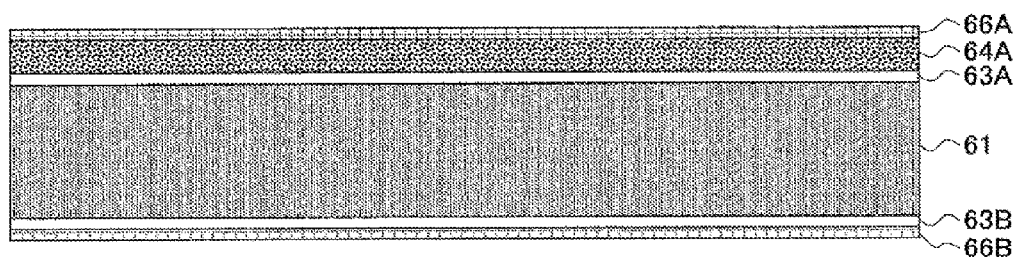

Then, the silicon wafer 61 is placed inside a third vertical furnace having substantially the same configuration as the vertical furnace 10 and a TEOS source gas together with oxygen gas is supplied into the third vertical furnace with the same flow rate as the first embodiment. Then, by performing a CVD method on the silicon wafer 61 by using TEOS as a source, a silicon oxide film 66A (which is to be an anti-reflection film) is formed on the poly-silicon film 64A on the front surface of the silicon wafer 61 and another silicon oxide film 66B is formed on the poly-silicon film 63B as illustrated in FIG. 4E. The silicon oxide films 66A, 66B are formed with the same film thickness as the silicon oxide films 26A, 26B of the first embodiment.

Figure 4F:
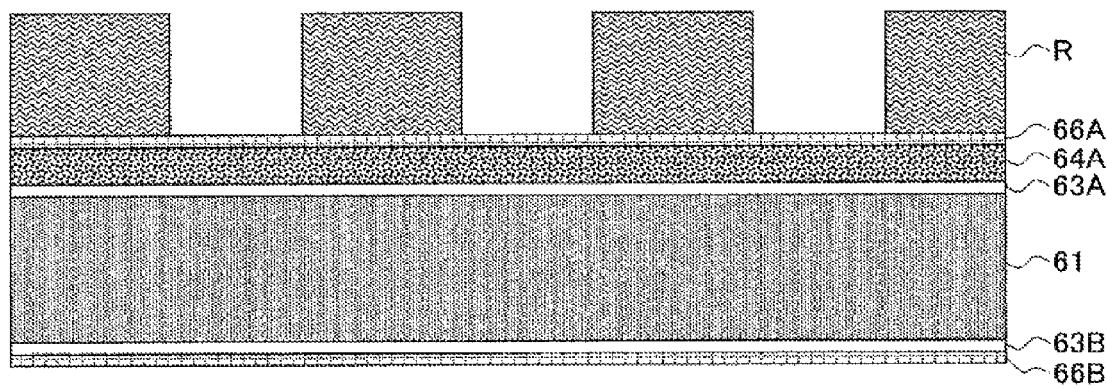

Then, as illustrated in FIG. 4F, a resist pattern R is formed on the anti-reflection film 66A on the front surface of the silicon wafer 61, so that device separating regions are exposed on prescribed areas on the front surface of the silicon wafer 61.

Figure 4G:
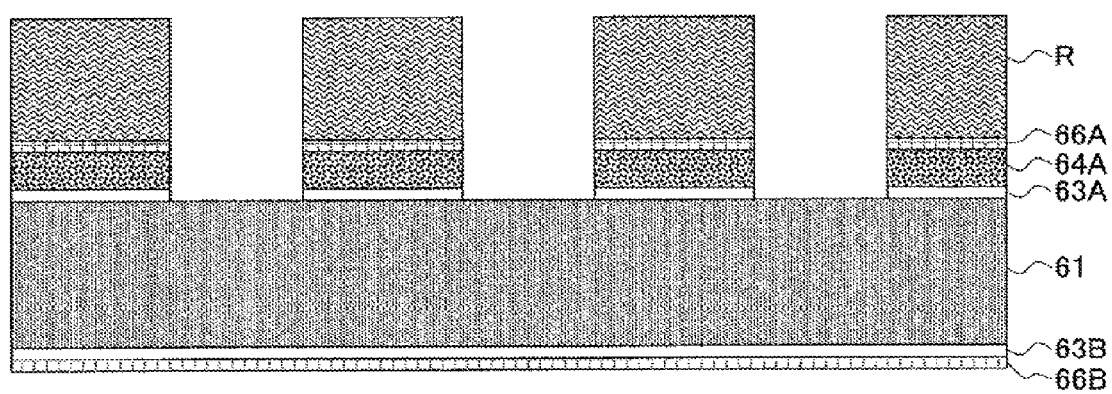

Then, by performing a dry-etching method on the silicon wafer 61 using the resist pattern R as a mask, the anti-reflection film 66A, the poly-silicon film 64A, and the pad oxide film 63A formed below the mask are patterned. Thereby, prescribed silicon surface areas on the front surface of the silicon wafer 61 become exposed as illustrated in FIG. 4G.

Figure 4H:
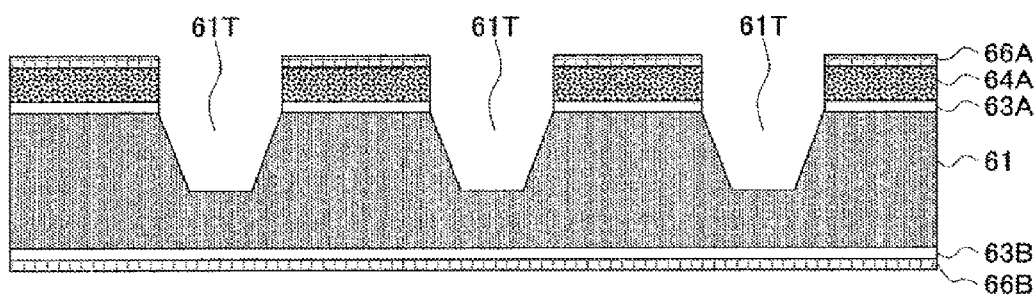
Figure 4I:
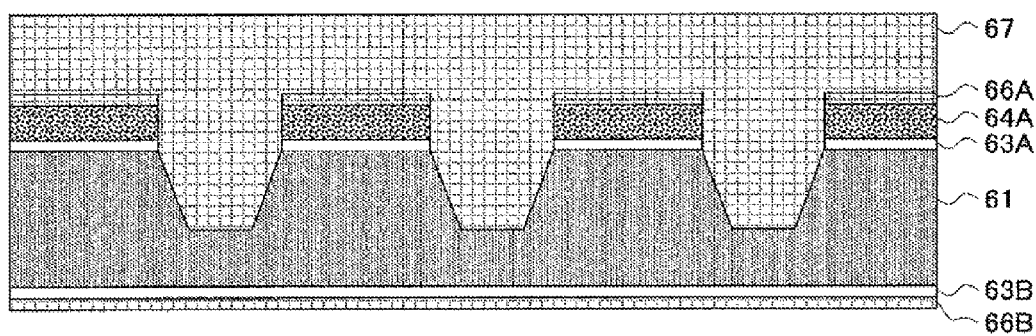

Then, as illustrated in FIG. 4H, by performing a dry-etching method on the silicon wafer 61 using the poly-silicon film 64A as a mask, device separating grooves 61T are formed on the front surface of the silicon wafer 61.

Then, the silicon wafer 61 is placed in a single wafer type plasma CVD apparatus (not illustrated) and is subject to a high density plasma CVD process for filling the device separating grooves 61T with the silicon oxide film 67 on the front surface of the silicon wafer 61.

Figure 4J:
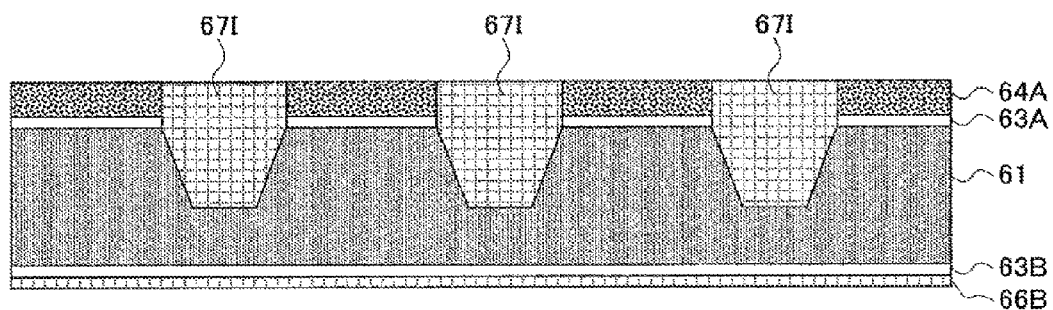
Figure 4K:
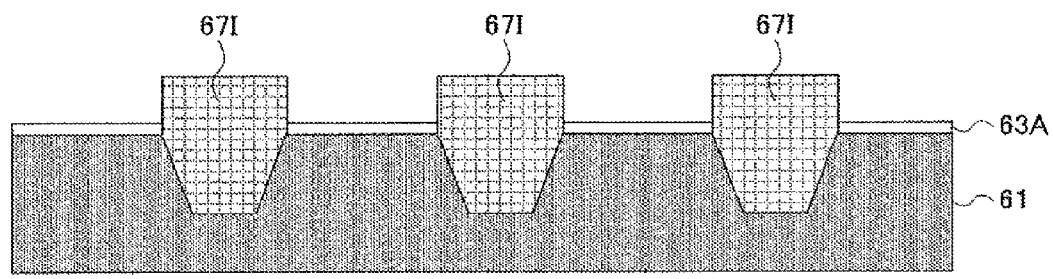

Then, the silicon wafer 61 is removed from the single wafer type plasma CVD apparatus and is subject to a chemical mechanical polishing process. The chemical mechanical polishing process is performed on the silicon wafer 61 until the poly-silicon film 64A provided below the silicon oxide film 67 is exposed. Thereby, a structure illustrated in FIG. 4J is obtained. The structure illustrated in FIG. 4J has each of its device separating grooves 61T filled by a device separating insulating film 67I.

Then, the structure illustrated in FIG. 4J is placed in a single wafer type wet-etching apparatus and is subject to a wet-etching process. The wet-etching is performed by using, for example, an aqueous solution containing a mixture of HF and nitric acid ($HNO_3$). By performing the wet-etching process, the silicon oxide film 66A on the front surface of the silicon wafer 61 is removed. In the wet-etching process, the silicon oxide films 63B and 66B are also affected by the wet-etching, such that the back surface of the silicon wafer 61 becomes exposed.

Figure 4L:
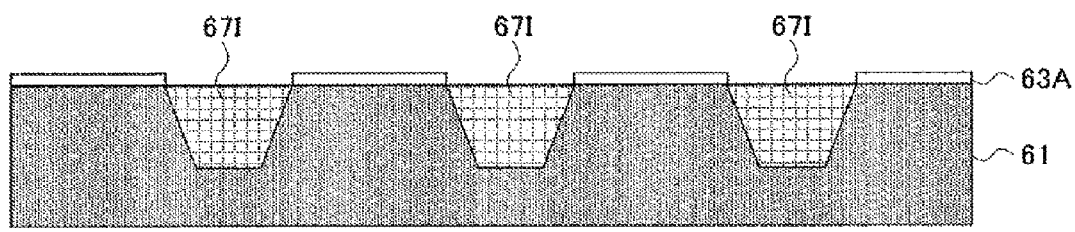

Then, as illustrated in FIG. 4L, the device separating insulating film 67I is flattened by performing a CMP (Chemical Mechanical Polishing) method and an HF process on the silicon wafer 61.

Figure 4M:
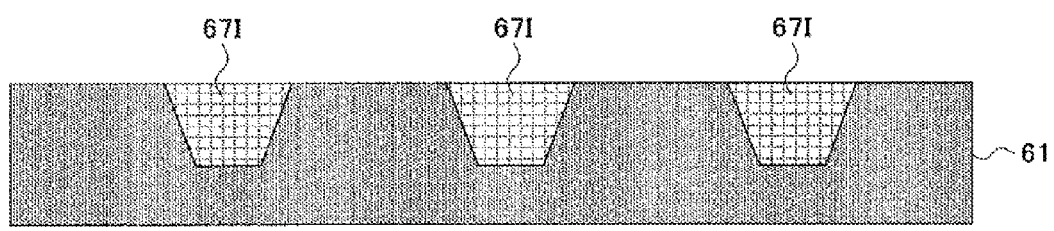

Then, as illustrated in FIG. 4M, the silicon oxide film 63A formed on the front surface of the silicon wafer 61 and other silicon oxide films are removed by using, for example, a single wafer type wet-etching apparatus, so that a fresh silicon surface is exposed at the front surface of the silicon wafer 61.

Figure 4N:
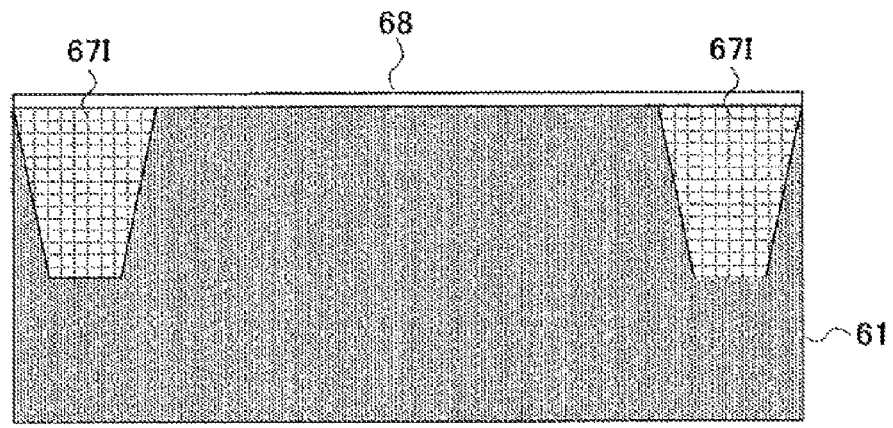

Then, as illustrated in FIG. 4N, the silicon wafer 61 having a configuration illustrated in FIG. 4M is placed inside a fourth vertical furnace having substantially the same configuration as the vertical furnace 10 and has oxygen gas supplied into the fourth vertical furnace for forming a thermal oxide film 68 (serving as a gate insulating film of a semiconductor having a film thickness of about 1.77 nm on the front surface (upper surface) of the silicon wafer 61.

In the comparative example, the back surface of the silicon wafer 61 is exposed. Thus, Si evaporates from the back surface of the silicon wafer 61. The evaporated Si may adhere to parts (e.g., temperature sensor) of the above-described vertical furnace used for depositing the thermal oxide film 68. As a result, temperature control or process control can be prevented from being adversely affected by the evaporated Si.

Then, the silicon wafer 61 having a configuration illustrated in FIG. 4N is placed inside a fifth vertical furnace having substantially the same configuration as the vertical furnace 10. By supplying a silane gas is supplied into the fifth vertical furnace and performing a CVD method on the silicon wafer 61, a poly-silicon film 69A is formed on the thermal oxide film 68 in the same manner as the poly-silicon film 29A. At the same time of forming the poly-silicon film 69A, a poly-silicon film 69B having the same film thickness as the poly-silicon film 69A is formed at the back surface of the silicon wafer 61.

Figure 4O:
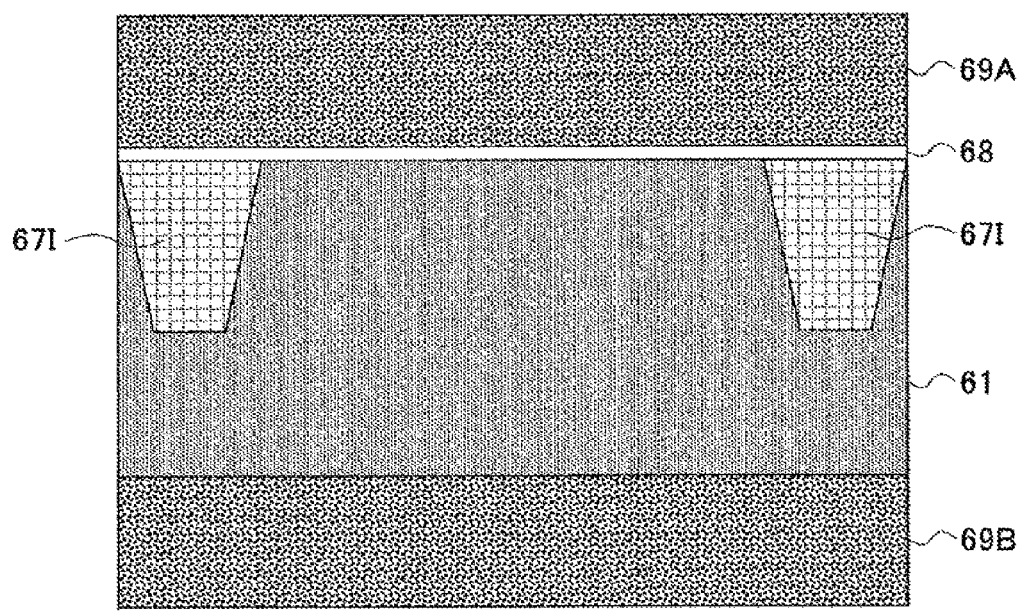
Figure 4P:
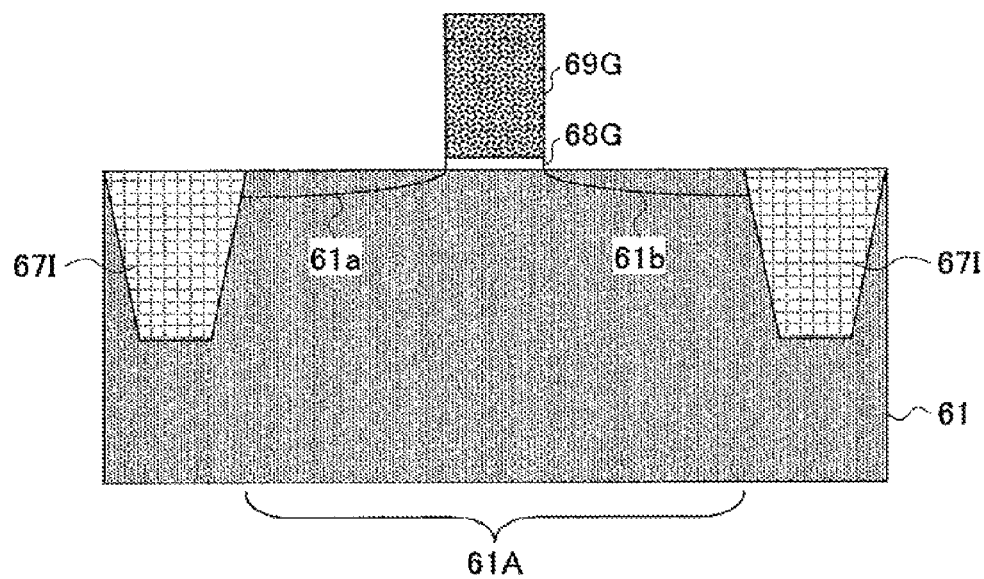

Then, the silicon wafer 61 having a configuration illustrated in FIG. 4O is removed from the fifth vertical furnace. Then, the poly-silicon film 69B formed on the back surface of the silicon wafer 61 is removed. Further, the poly-silicon film 69A and the thermal oxide film 68 provided below the poly-silicon film 69A are patterned by using resist on the silicon wafer 61. Thereby, a poly-silicon gate electrode 69G and a gate insulating film 68G are formed on the silicon wafer 61 as illustrated in FIG. 4P. Then, by using the poly-silicon gate electrode 69G as a mask, a p-type or n-type impurity element is implanted (ion implantation) into the silicon wafer 61. Thereby, diffusion regions 61a, 61b are formed in a device region 61A separated (delineated) by device separating regions 67I at the front surface of the silicon wafer 61. The diffusion regions 61a, 61b serve as LDDs (Lightly Doped Drains).

Then, the silicon wafer 61 having a configuration illustrated in FIG. 4P is placed inside a sixth vertical furnace having substantially the same configuration as the vertical furnace 10. By introducing ammonia ($NH_3$) and silane gas into the sixth vertical furnace and performing a CVD method on the front surface of the silicon wafer 61, a silicon nitride film 70A is formed in a manner covering the poly-silicon gate electrode 69G. At the same time of forming the silicon nitride film 70A, another silicon nitride film 70B is formed in a manner covering the back surface of the silicon wafer 61.

Figure 4Q:
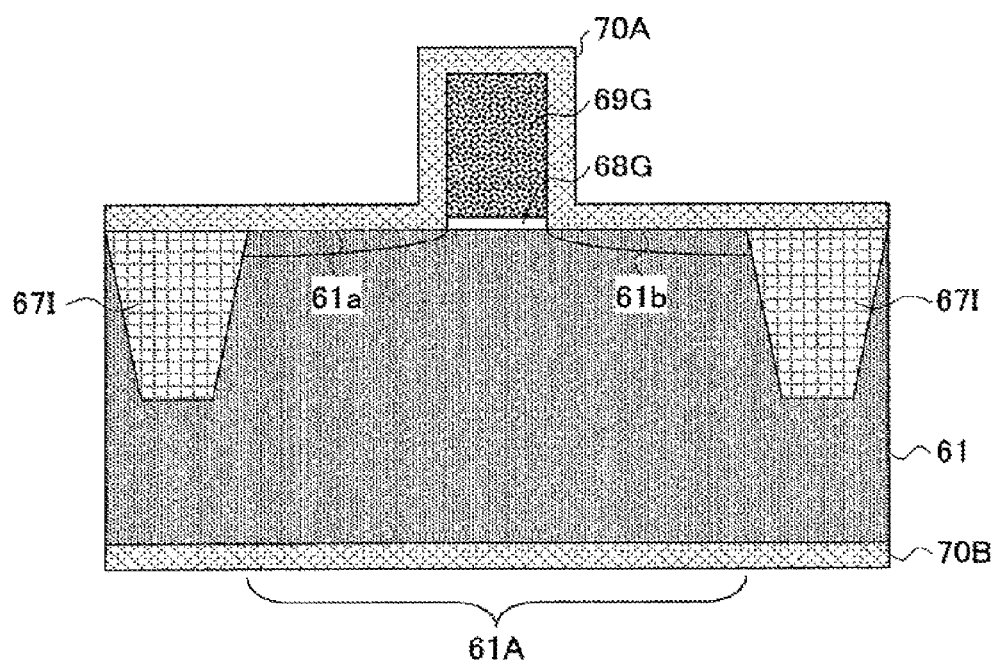

Then, the silicon wafer 61 having a configuration illustrated in FIG. 4Q is removed from the sixth vertical furnace and is subject to an anisotropic etching with respect to a direction orthogonal to the front surface of the silicon wafer 61. Accordingly, the silicon nitride film 70A is etch-backed, to thereby form a side wall insulating film 70W on both walls of the gate electrode 69G. Then, by using the gate electrode 69G and the side wall insulating film 70W as a mask, a p-type or n-type impurity element is implanted (ion implantation) into the silicon wafer 61. Thereby, diffusion regions 61c, 61d are formed in the device region 61A inside the silicon wafer 61. The diffusion regions 61c, 61d serve as a source region and a drain region at the outer sides of the side wall insulating film 70W.

Figure 4R:
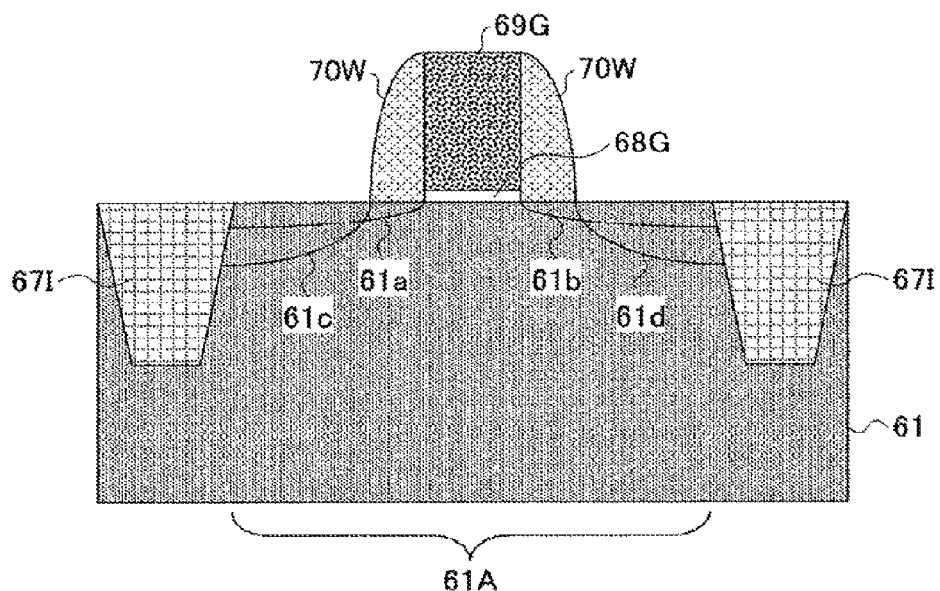

In the process illustrated in FIG. 4R, the back surface of the silicon wafer 61 is exposed.

Figure 4S:
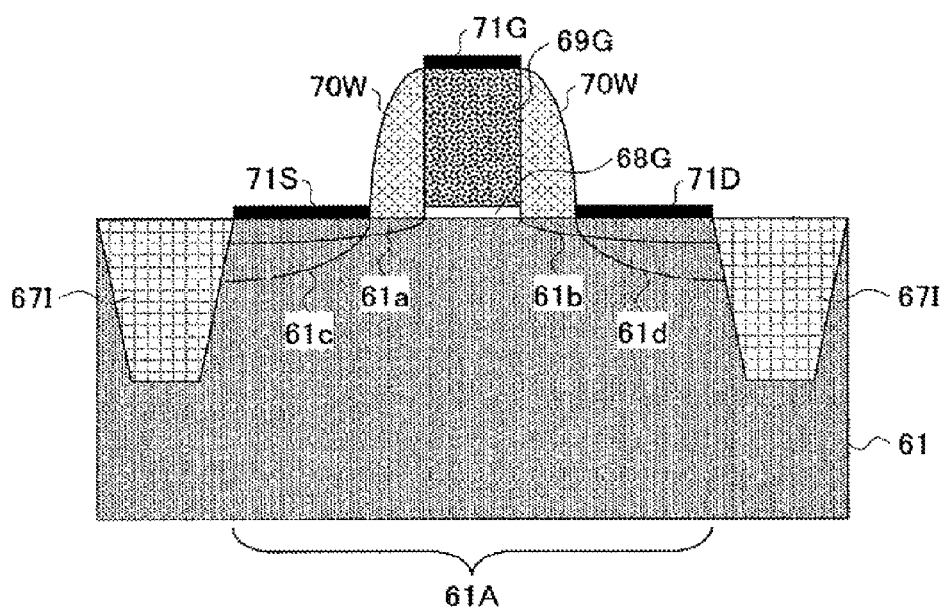

Further, as illustrated in FIG. 4S, silicide regions 71S, 71D, and 71G are formed on the corresponding diffusion regions 61c, 61d, and the gate electrode 69G by using, for example, a typical salicide method.

Figure 4T:
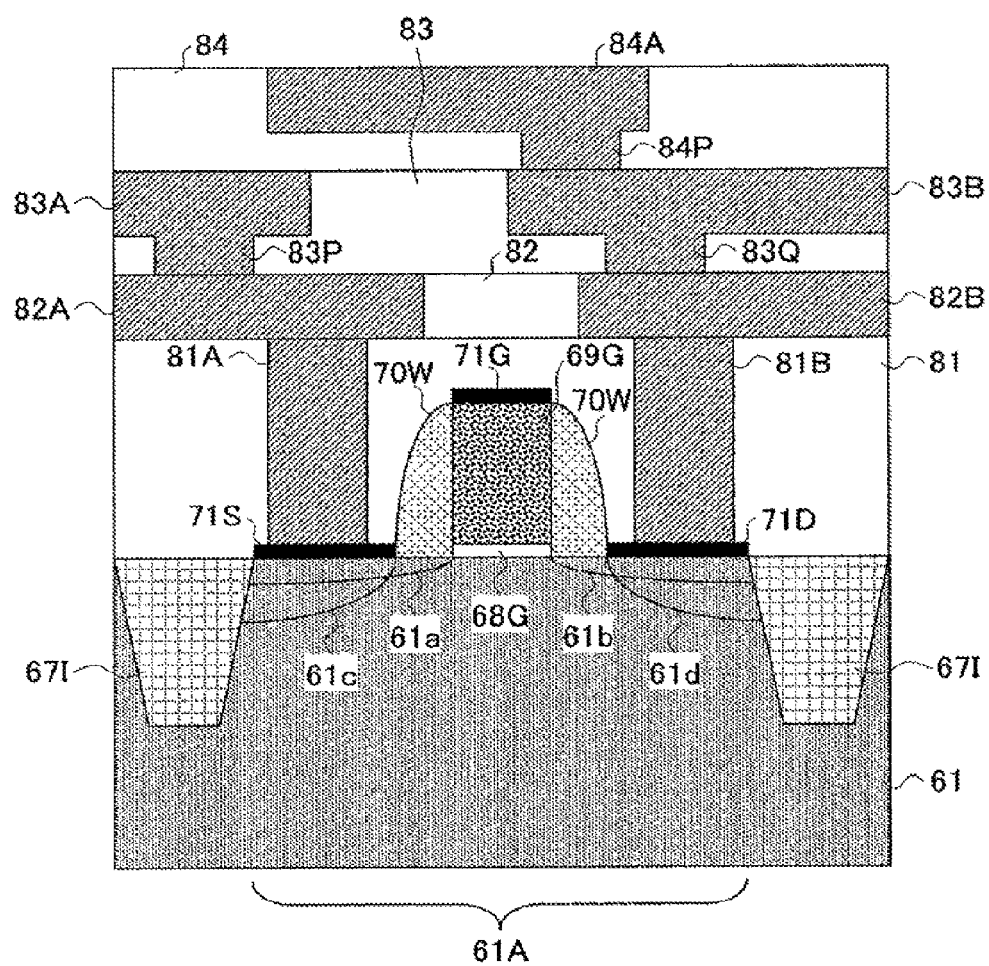

Then, as illustrated in FIG. 4T, an insulating film 81 is formed on the configuration illustrated in FIG. 4S in a manner covering the gate electrode 69G. Further, conductive plugs 81A, 81B (e.g., formed of tungsten (W)) that contact the silicide regions 71S, 71D are formed inside the insulating film 81.

Further, an interlayer insulating film 82 is formed on the insulating film 81. Further, copper (Cu) wiring patterns 82A, 82B that contact the conductive plugs 81A, 81B are formed inside the interlayer insulating film 82 by using, for example, a damascene method.

Further, another interlayer insulating film 83 is formed on the interlayer insulating film 82. Further, a Cu wiring pattern 83A including a via plug 83P is formed inside the interlayer insulating film 83 and in contact with the Cu wiring pattern 82A by using, for example, a dual damascene method. Further, a Cu wiring pattern 83B including a via plug 83Q is formed inside the interlayer insulating film 83 and in contact with the Cu wiring pattern 82B by using, for example, a dual damascene method.

Further, another interlayer insulating film 84 is formed on the interlayer insulating film 83. Further, a Cu wiring pattern 84A including a via plug 84P is formed inside the interlayer insulating film 84 and in contact with the Cu wiring pattern 83B by using, for example, a dual damascene method.

Thus, the above-described interlayer insulating films 82-84, the Cu wiring patterns 82A, 82B, 83A, 83B, 84A, and the Cu via plugs 83P, 83Q, 84P form a multilayer wiring structure on the front surface of the silicon wafer 61.

Because the Cu wiring patterns and the Cu via plugs are formed by using an electrolytic plating method in forming the multilayer wiring structure with the comparative example, Cu atoms inside the plating liquid may accumulate in a case where the silicon surface of the back surface of the silicon wafer 61 of FIG. 4T is exposed. As a result, the accumulated Cu atoms may be dispersed to the front surface of the silicon wafer 61 in a subsequent process.

Although the first-sixth vertical furnaces used in the comparative example have substantially the same configuration as the vertical furnace illustrated in FIG. 1, the first-sixth vertical furnaces do not have to correspond (1:1) to the vertical furnaces of the first embodiment. For example, a part of or all of the first-sixth furnaces used in the comparative example may be the same.

Figure 5:
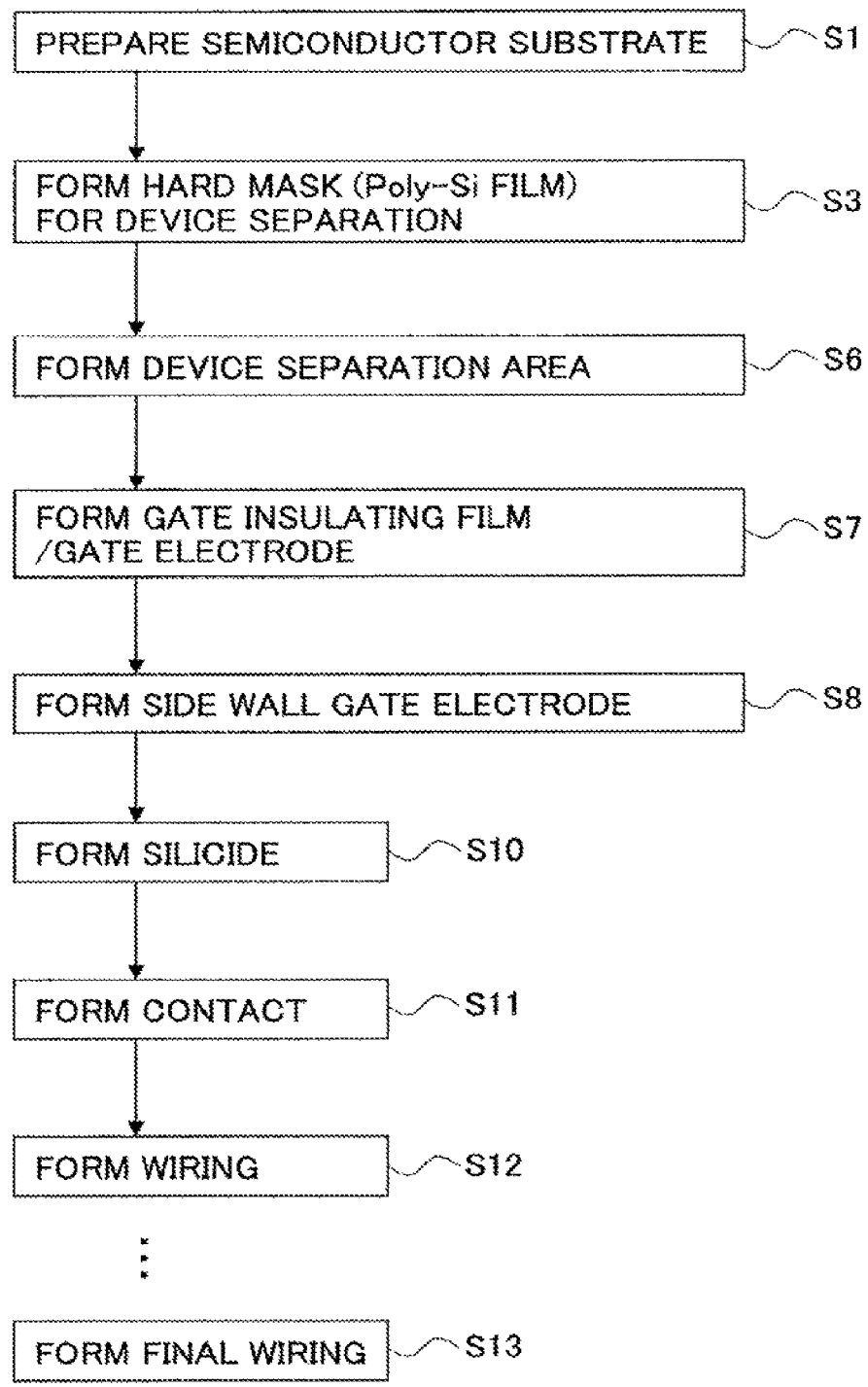
FIG. 5 is a flowchart illustrating processes (including the steps illustrated with FIGS. 4A-4T) in the semiconductor device manufacturing method according to the comparative example.

FIG. 5 is a flowchart illustrating processes (including the steps illustrated with FIGS. 4A-4T for manufacturing a semiconductor device according to the comparative example.

With reference to FIG. 5, Step S1 corresponds to the process described with FIG. 4A.

Step S3 corresponds to the processes described with FIGS. 4B and 4D where the poly-silicon film 64A which to be used as a hard mask in a subsequent process of forming a device separating structure, is formed so only the poly-silicon film 64A remains on the front surface of the silicon wafer 61.

Step S6 corresponds to the processes described with FIGS. 4E through 4M where device separating insulating regions (device separating insulating film) 67I are formed by burying the device separating grooves 61T formed on the front surface of the silicon wafer 61.

Step S7 corresponds to the processes described with FIGS. 4N through 4P where the thermal oxide film 68, which is to be a gate insulating film, is formed on the front surface of the silicon wafer 61. Then, the gate electrode 69G is formed on the thermal oxide film 68. As described above, the back surface of the silicon wafer 61 is exposed. Therefore, in the step of forming the thermal oxide film 68, Si atoms cannot be prevented from evaporating from the exposed back surface of the silicon wafer 61. Thus, irregularity may occur in the temperature control by the vertical furnace used for forming the thermal oxide film 68.

Step S8 corresponds to the processes described with FIGS. 4Q and 4R. That is, silicon nitride films 70A and 70B are formed on the front and back surfaces of the silicon wafer 61. Further, the side wall insulating films 30W are formed on both side walls of the gate electrode 69G by etching-back the silicon nitride film 70A on the front surface of the silicon wafer 61. Then, the silicon nitride film 70B is removed from the back surface of the silicon wafer 61.

Step S10 corresponds to the process described with FIG. 4S where the silicide layers 71S, 71D, 71G are formed on corresponding front surfaces of the diffusion regions 61c, 61d, and the gate electrode 69G.

Step S11 corresponds to the processes of forming the insulating film 81 and the via plugs 81A, 81B as described with FIG. 4T.

Steps S12-S13 correspond to the process of forming the multilayer wiring structure as described with FIG. 2W.

Thus, as described above, with the semiconductor device manufacturing method according to comparative example, the back surface of the silicon wafer 21 is exposed throughout the processes for forming the multilayer wiring structure. As a result, in the process of forming the multilayer wiring structure including a Cu deposition step using an electrolytic-plating method, the back surface of the silicon wafer 61 may be contaminated by Cu.

In comparing the flowchart of FIG. 3 with the flowchart of FIG. 5, the first embodiment has a step between Step S1 and S3 where a silicon oxide film 22 or 22A covering the back surface of a silicon wafer is formed. Further between Step S3 and Step S6 according to the first embodiment, there is a step of forming a poly-silicon film 24B for protecting the silicon oxide film 22A covering the back surface of the silicon wafer 21, a step of forming a silicon oxide film 25B for protecting the poly-silicon film 24B, and forming the device separating insulating film 27I while protecting the back surface of the silicon wafer 21 with at least the silicon oxide film 22A. Thereby, Si evaporation occurring at the back surface of the silicon wafer 21 when forming the thermal oxide film (gate insulating film) 28 can be controlled. Further, Cu can be prevented from contaminating the back surface of the silicon wafer 21 when forming the multilayer wiring structure.

Figure 6A:
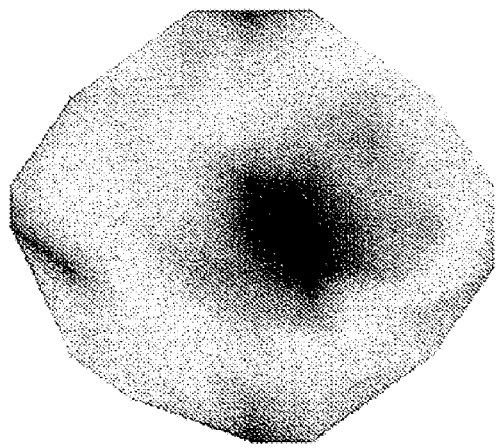
FIG. 6A is a schematic diagram illustrating the distribution of film thicknesses of a thermal oxide film with respect to the in-plane direction according to the first embodiment.
Figure 6A:

FIG. 6A illustrates the manner in which the thermal oxide film 28 on the silicon wafer 21 is distributed with respect to the in-plane direction in a case where the process described with FIG. 2Q is performed using the vertical furnace 10 illustrated in FIG. 1. In FIG. 6A, the light areas represent areas of the thermal oxide film 28 that have high film thickness, and the dark areas represent areas of the thermal oxide film 28 that have low film thickness. The bar (color bar) illustrated in the lower part of FIG. 6A indicates the upper and lower limits of the film thickness of the thermal oxide film 28.

A target film thickness of 1.77 nm can be fairly well achieved because FIG. 6A illustrates that the average film thickness of the thermal oxide film 28 obtained in the process of FIG. 2Q is 1.79 nm. Although the film thickness of the thermal oxide film 28 of the silicon wafer 21 with respect to the in-plane direction ranges from 1.7676 nm through 1.8035 nm, such film thickness exhibits a variable (fluctuation) range of approximately 0.04 nm.

Figure 6B:
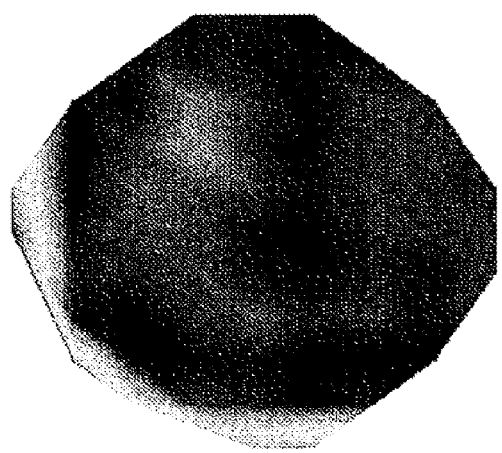
FIG. 6B is a schematic diagram illustrating the distribution of film thicknesses of a thermal oxide film with respect to the in-plane direction according to the comparative example.
Figure 6B:
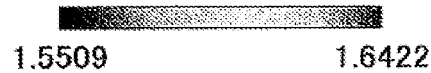

Meanwhile, FIG. 6B illustrates the manner in which a thermal oxide film on a silicon wafer 21' of a comparative example is distributed with respect to the in-plane direction in a case where the process described with FIG. 2Q is performed using the vertical furnace 10 illustrated in FIG. 1. However, the silicon wafer 21' of the comparative example has a silicon nitride film 21N formed on the back surface of the silicon wafer instead of a silicon oxide film.

As illustrated in FIG. 6B, an average film thickness of the thermal oxide film obtained in this case is about 1.60 nm, which is about 0.17 nm less than the target film thick of 1.77 nm. According to the color bar of FIG. 6B indicating the upper and lower limits of the film thickness of the thermal oxide film of the comparative example, the variable (fluctuation) range of the film thickness increases to approximately 0.09 nm compared to that of the thermal oxide film 28.

Figure 7A:
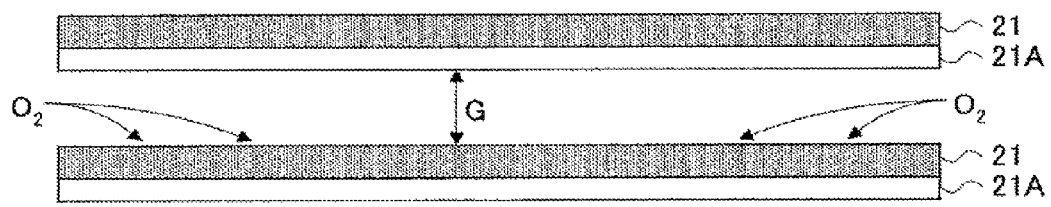
FIG. 7A is a schematic diagram for describing a result of FIG. 6A.

FIG. 7A illustrates a result of performing the thermal oxidation process described with FIG. 2Q in a state where plural silicon wafers 21 are stacked in a vertical direction inside the vertical furnace 10. In this case, a silicon oxide film 21A is formed on the back side of each silicon wafer 21.

With reference to FIG. 7A, the silicon wafers 21 (in this case, upper and lower silicon wafers 21) are stacked one on top of another in the vertical direction and have gaps (intervals) G provided therebetween. The oxidation of the front surface of the silicon wafers 21 is performed by guiding oxygen gas into the gaps. In this case, the back surface of the upper silicon wafer 21, facing the front surface of the lower silicon wafer 21, is covered with the silicon oxide film 21A. Accordingly, the oxygen gas guided into the gaps can reach to the upper surface of the lower silicon wafer 21 without being consumed by other silicon wafers 21.

Figure 7B:
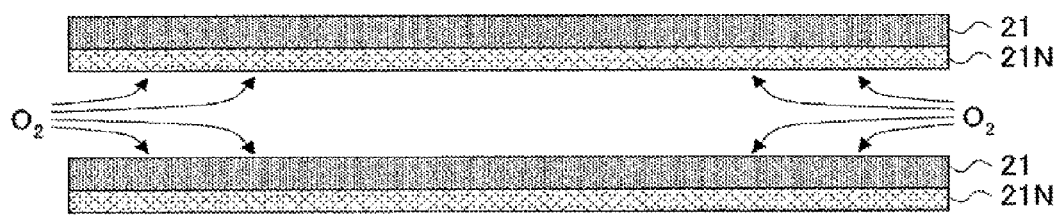
FIG. 7B is a schematic diagram for describing a result of FIG. 6B.

FIG. 7B also illustrates a result of performing the thermal oxidation process described with FIG. 2Q in a state where plural silicon wafers 21 are stacked in a vertical direction inside the vertical furnace 10. However, in this case, a silicon nitride film 21N is formed on the back side of each silicon wafer 21.

With reference to FIG. 7B, the silicon wafers 21 (in this case, upper and lower silicon wafers 21) are stacked one top of another in the vertical direction and have gaps (intervals) G provided therebetween. The gap may range from, for example, 5 through 8 mm. The oxidation of the front surface of the silicon wafers 21 may be performed by guiding oxygen gas into the gaps. In this case, the back surface of the upper silicon wafer 21, facing the front surface of the lower silicon wafer 21, is covered with the silicon nitride film 21N. This causes the oxygen gas guided into the gaps to be consumed not only by the upper surface of the lower silicon wafer 21 but also by silicon nitride film 21N on the back surface of the upper silicon wafer (oxidation of the silicon nitride film 21N). As a result, the silicon oxide film of the lower silicon wafer 21 becomes thinner and increases the distribution of film thickness with respect to the in-plane direction.

Figure 8:
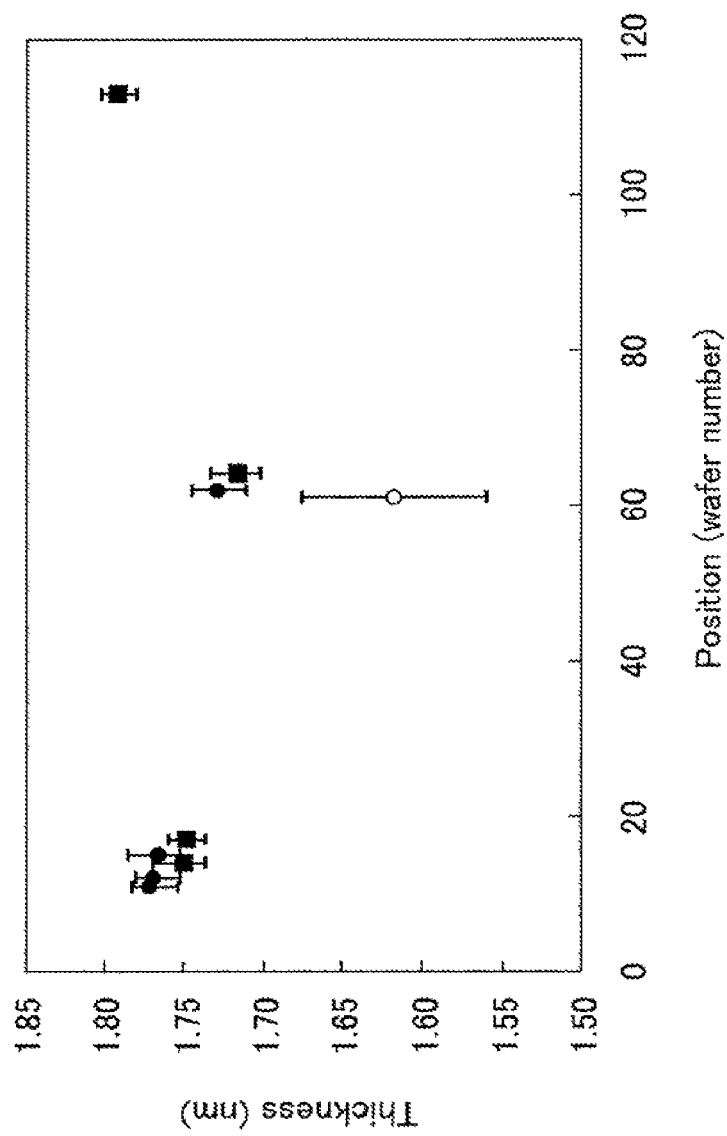
FIG. 8 is a graph for describing the film thicknesses of thermal oxide films formed on silicon wafers formed with various films on their back surfaces.

FIG. 8 is a graph illustrating a relationship between the film thickness of a thermal oxide film and the position of wafers inside the vertical furnace 10 in a case where the thermal oxidation process described with FIG. 2Q is performed on 120 silicon wafers inside the vertical furnace 10. In FIG. 8, the horizontal axis of the graph represents the position of the 120 wafers inside the vertical furnace 10 in which the wafers are counted from the bottom (#0) of the vertical furnace 10. The vertical axis of the graph represents the thickness of the thickness of the wafers. In FIG. 8, a symbol "●" indicates a silicon wafer having its back surface covered by a thermal oxide film, a symbol "■" indicates a silicon wafer having its back surface covered by a CVD oxide film using a TEOS source, and a symbol "○" indicates a silicon wafer having its back surface covered by a silicon nitride film. In FIG. 8, the bars illustrated together with the symbols indicate the variable (fluctuation) range of the film thickness of the thermal oxide film formed on the front surface of the silicon wafers with respect to the in-plane direction.

With reference to FIG. 8, it can be understood that the thermal oxide film formed on the front surface of the silicon wafer exhibits little difference of film thickness regardless of whether the back surface of the silicon wafer is covered by the thermal oxide film or by the CVD oxide film. Further, the film thickness of the thermal oxide film formed on the front surface of the silicon wafer exhibits a film thickness substantially the same as the target film thickness of 1.77 nm regardless of whether the back surface of the silicon wafer is covered by the thermal oxide film or by the CVD oxide film.

On the other hand, the thermal oxide film formed on the front surface of the silicon wafer exhibits a significant decrease of film thickness where a silicon nitride film may be formed on the back surface of the silicon wafer. Further, the thermal oxide film formed on the front surface of the silicon wafer exhibits a significant increase in the distribution (variation) of film thickness with respect to the in-plane direction.

Accordingly, by covering a back surface of a silicon wafer with an oxide film having a film thickness no less than 200 nm in a case of fabricating a device separating structure, a thermal oxide film, and a multilayer wiring structure on a front surface of the silicon wafer, an oxide film having a desired film thickness can be evenly distributed on the silicon wafer with respect to the in-plane direction. For example, even in case of forming a thermal oxide film in a thermal oxidation process as illustrated in FIG. 2Q, an oxide film having a desired film thickness can be evenly distributed on the silicon wafer with respect to the in-plane direction.

In general, since a natural oxide film is formed on a front surface of a silicon wafer, it may seem that a silicon wafer having the natural oxide film can be used as the silicon wafer 21. However, it is to be noted that the processes (e.g., HF process) described with FIGS. 2O and 2P are performed immediately before the process described with FIG. 2Q. Therefore, in a case where the film thickness of the silicon oxide film on the back surface of the silicon wafer is less than 200 nm, the silicon oxide film may be undesirably etched by the HF process and cause the back surface of the silicon wafer to be exposed in the process of FIG. 2Q or FIG. 2W.

Further, according to the above-described embodiment, the silicon oxide film 22A is protected by the poly-silicon film 24B from the process of FIG. 2E to FIG. 2N. Furthermore, the poly-silicon film 24B is protected by the silicon oxide film 25B from the process of FIG. 2F to FIG. 2M.

Thus, according to the above-described embodiment, the silicon oxide film 22A can consistently and continuously remain on the back surface of the silicon wafer 21 until the end of the process of forming the multilayer wiring structure of FIG. 2W. Therefore, irregular temperature control in the vertical furnace 10 caused by Si atoms evaporating from the back surface of the silicon wafer 21 during the formation of the thermal oxide film 28 (process illustrated in FIG. 2Q) can be prevented. Further, the back surface of the silicon wafer 21 can be prevented from being contaminated by Cu atoms during the formation of the multilayered wiring structure (process illustrated in FIG. 2W). Thereby, operations failure of the manufactured semiconductor device due to Cu atoms dispersing from the back surface of the silicon wafer 21 can be prevented.

Although the semiconductor device manufacturing method according to the first embodiment is performed using separate first-eighth vertical furnaces, a part of or all of the first-eighth furnaces may be the same.

Second Embodiment

Figure 9A:
FIGS. 9A-9W are schematic diagrams for describing the processes in a semiconductor device manufacturing method according to the second embodiment.

With reference to FIG. 9A, according to the second embodiment, a silicon wafer 101 having a diameter of, for example, 300 mm is prepared. The silicon wafer 101 is prepared including a back surface having an oxidized film with a film thickness no greater than 100 nm or prepared without any oxidized film.

Figure 9B:
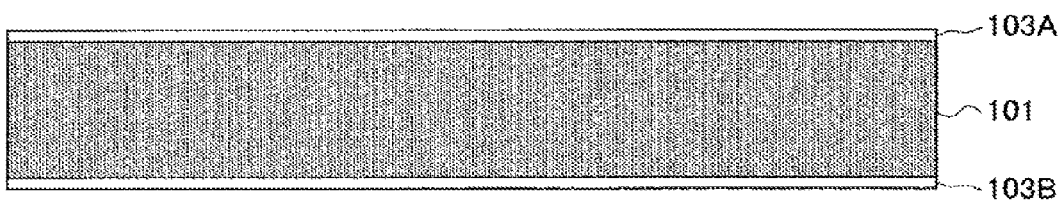

The silicon wafers 101 are placed in a first vertical furnace having substantially the same configuration as the vertical furnace 10. In this embodiment also, plural silicon wafers 101 are placed inside the first vertical furnace at prescribed intervals in a vertical direction. The silicon wafer(s) 101 are maintained with a substrate temperature of, e.g., 800-1100° C. inside the vertical furnace and are subject to a thermal oxidation process in an oxygen gas atmosphere inside the first vertical furnace. Accordingly, as illustrated in FIG. 9B, a thermal oxide film 103A (which is to be a pad oxide film) is formed on an exposed front surface of the silicon wafer 101 and another thermal oxide film 103B is formed on an exposed back surface of the silicon wafer 101. The thermal oxide films 103A, 103B are formed having a film thickness of, for example, 100 nm.

Figure 9C:
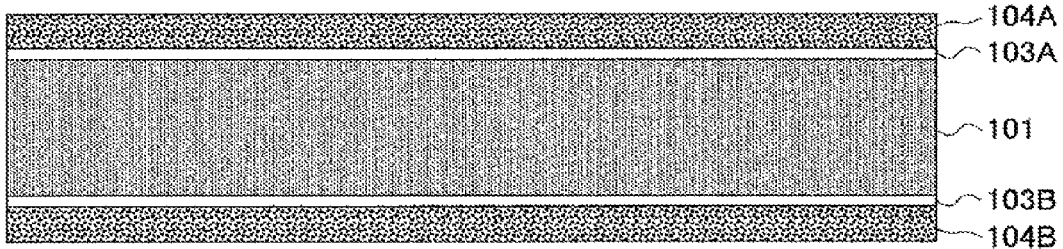

Then, the silicon wafer 101 is placed inside a second vertical furnace having substantially the same configuration as the vertical furnace 10 and a silicon source gas (e.g., silane gas) is supplied into the second vertical furnace with the same flow rate as the first embodiment, so that a poly-silicon film 104A is formed on the thermal oxide film 103A and another poly-silicon film 104B is formed on the thermal oxide film 103B as illustrated in FIG. 9C. The poly-silicon films 104A, 104B have substantially the same film thickness as that of the poly-silicon films 24A, 24B of the first embodiment.

Figure 9D:
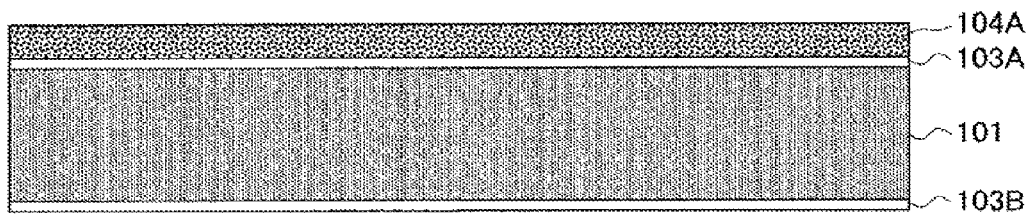
Figure 9E:
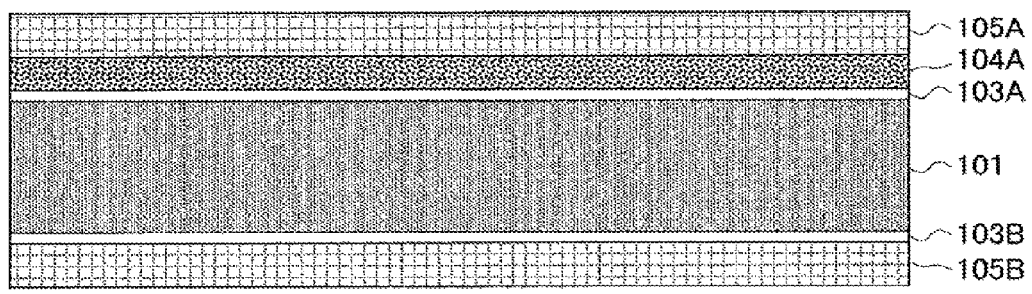

Then, as illustrated in FIG. 9D, the silicon wafer 101 is removed from the second vertical furnace and has the poly-silicon film 104B removed from its back surface by, e.g., wet-etching.

Then, the silicon wafer 101 is placed inside a third vertical furnace having substantially the same configuration as the vertical furnace 10 for forming a silicon oxide film 105A on the poly silicon film 104A on the front surface of the silicon wafer 101. The silicon oxide film 105A is formed by supplying a TEOS source gas together with oxygen gas into the third vertical furnace with the same flow rate as the first embodiment. At the same time of forming the silicon oxide film 105A, a silicon oxide film 105B having the same thickness as the silicon oxide film 105A is formed on the thermal oxide film 103B on the back surface of the silicon wafer 101.

Figure 9F:
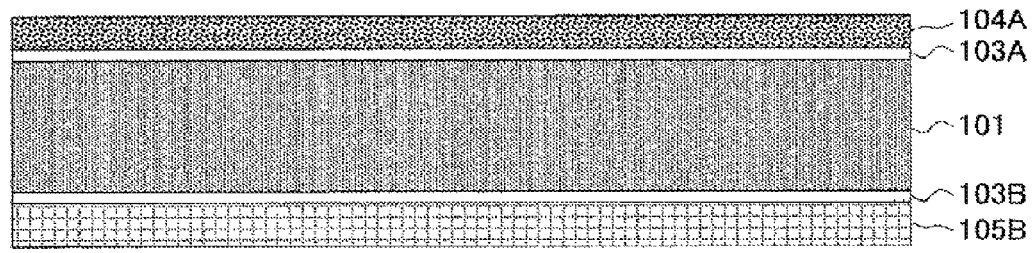

Then, as illustrated in FIG. 9F, the silicon oxide film 105A is removed by wet-etching.

Figure 9G:
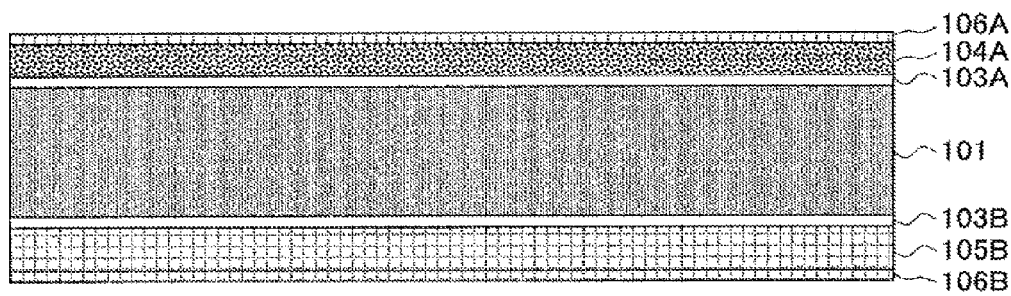

Then, as illustrated in FIG. 9G, the silicon wafer 101 is placed inside a fourth vertical furnace having substantially the same configuration as the vertical furnace 10 for forming a silicon oxide film 106A on the poly-silicon film 104A. The silicon oxide film 106A is formed by performing a CVD method using a TEOS source with respect to the structure illustrated in FIG. 9F. Another silicon oxide film 106B is also formed on the silicon oxide film 105B.

Figure 9H:
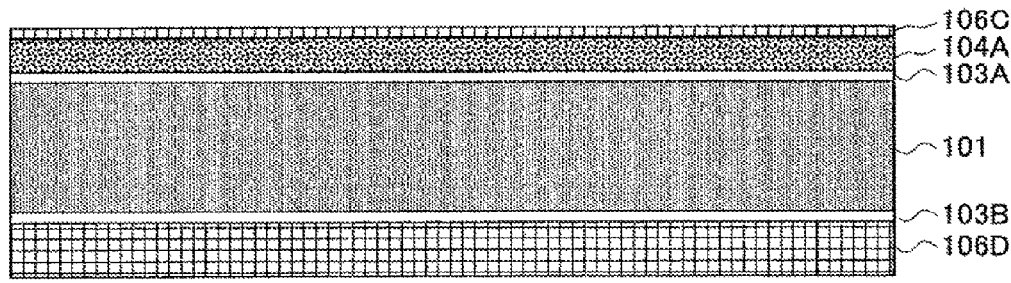

Then, as illustrated in FIG. 9H, the structure illustrated in FIG. 9G is thermally processed. As a result, the silicon oxide films 106A and 106B are transformed into a silicon oxide film (anti-reflection film) 106C and a silicon oxide film 106D that are denser and have higher HF resistance.

Figure 9I:
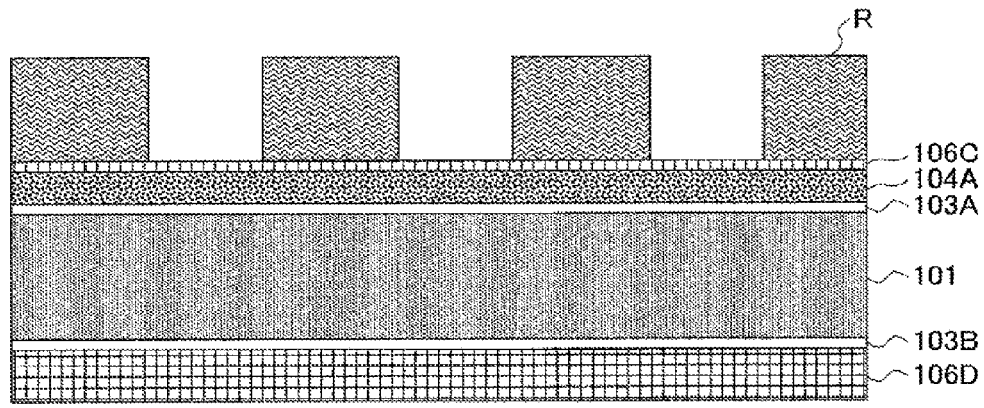

Then, as illustrated in FIG. 9I, a resist pattern R is formed on the silicon oxide film (anti-reflection film) 106C on the front surface of the silicon wafer 101, so that device separating regions are exposed on prescribed areas on the front surface of the silicon wafer 101.

Figure 9J:
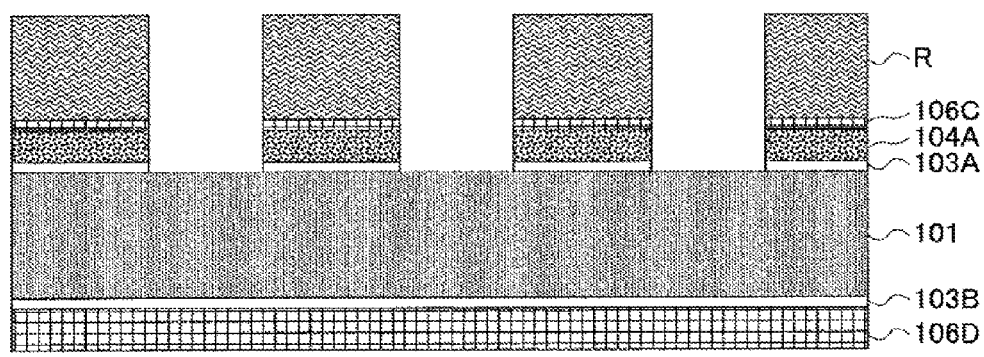

Then, by performing, e.g., a dry-etching method on the silicon wafer 101 using the resist pattern R as a mask, the anti-reflection film 106C, the poly-silicon film 104A, and the pad oxide film 103A formed below the mask are patterned. Thereby, prescribed silicon surface areas on the front surface of the silicon wafer 101 become exposed as illustrated in FIG. 9J.

Figure 9K:
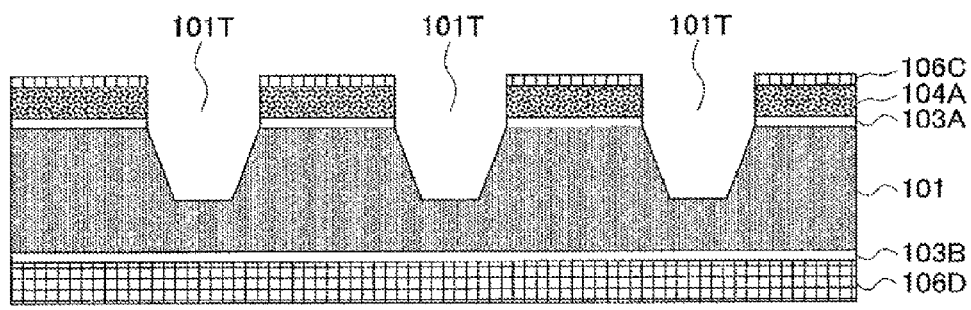
Figure 9L:
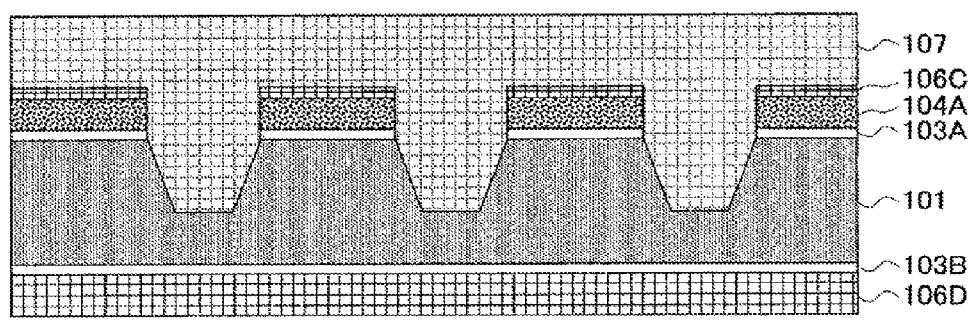

Then, as illustrated in FIG. 9K, by performing, e.g., a dry-etching method on the silicon wafer 101 using the poly-silicon film 104A as a mask, device separating grooves 101T are formed on the front surface of the silicon wafer 101.

Then, the silicon wafer 101 is placed in a single wafer type plasma CVD apparatus (not illustrated) and is subjected to a high density plasma CVD process for filling the device separating grooves 101T with the silicon oxide film 107 on the front surface of the silicon wafer 101.

Figure 9M:
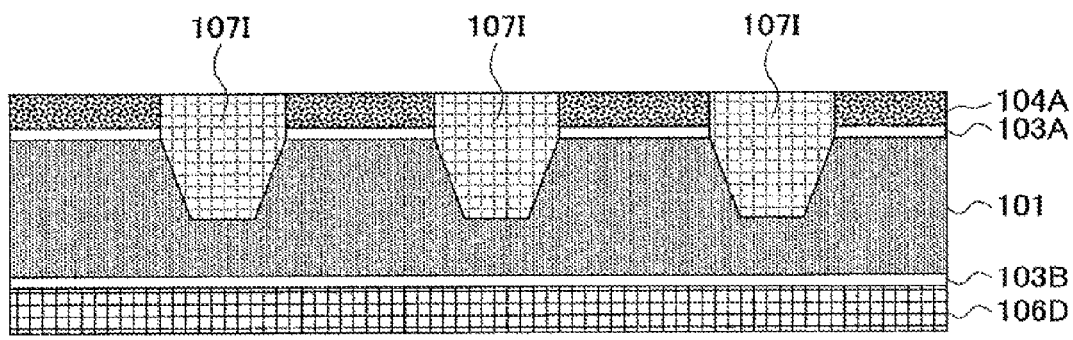

Then, the silicon wafer 101 is removed from the single wafer type plasma CVD apparatus and is subject to a chemical mechanical polishing process. The chemical mechanical polishing process is performed on the silicon wafer 101 until the poly-silicon film 104A provided below the silicon oxide film 107 is exposed. Thereby, a structure illustrated in FIG. 9M is obtained. The structure illustrated in FIG. 9M has each of its device separating grooves 101T filled by a device separating insulating film 107I.

Figure 9N:
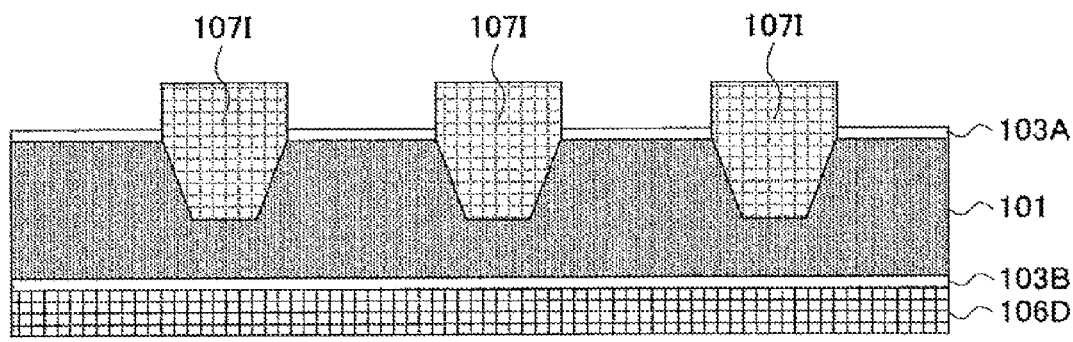

Then, the structure illustrated in FIG. 9M is placed in, for example, a single wafer type wet-etching apparatus and is subject to a wet-etching process. The wet-etching process is performed by using, for example, an aqueous solution containing a mixture of HF and nitric acid ($HNO_3$). By performing the wet-etching process, the poly-silicon film (hard mask) 104A on the front surface of the silicon wafer 101 is removed as illustrated in FIG. 9N. In the wet-etching process, the silicon oxide film 106D is also affected by the wet-etching. However, due to the silicon oxide film 106D being formed with a film thickness no less than 200 nm and having an improved HF resistance (as described in the thermal process of FIG. 9H), the silicon oxide film 106D on the back surface of the silicon wafer 101 will not be removed even in the case where the wet-etching process for, removing the poly-silicon film 104A is performed as illustrated in FIG. 9N.

Figure 9O:
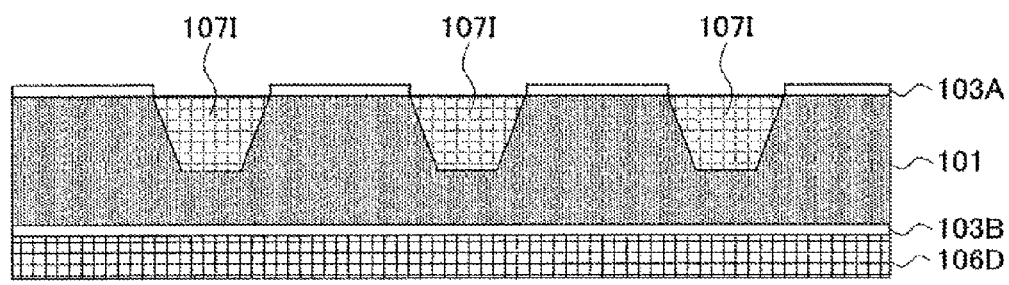

Then, as illustrated in FIG. 9O, the device separating insulating film 107I is flattened by performing a CMP (Chemical Mechanical Polishing) method and an HF process on the silicon wafer 101.

It is to be noted that, although the poly-silicon films 104A and 104B are utilized in performing the processes (steps) illustrated in FIGS. 9D-9P for forming a device separating structure, a single layer amorphous silicon film, a single layer silicon oxynitride film, a single layer silicon nitride film, a layered structure of a silicon nitride film and a silicon oxide film formed of TEOS, or a layered structure of a silicon nitride film, a poly-silicon or amorphous silicon film, and a silicon oxide film formed of TEOS may also be utilized.

Figure 9P:
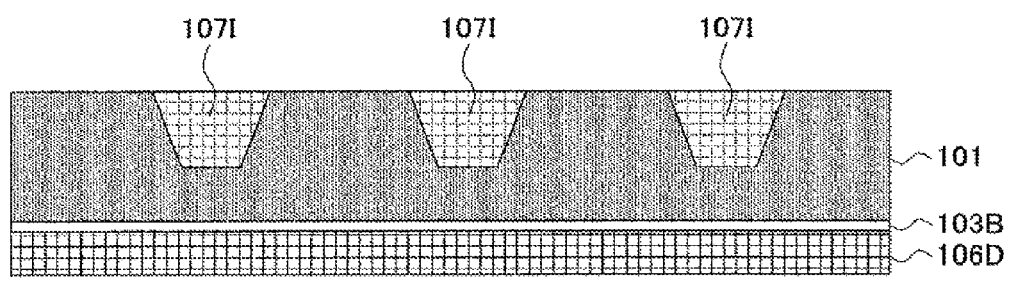

Then, as illustrated in FIG. 9P, the thermal oxide film 103A formed on the front surface of the silicon wafer 101 and other silicon oxide films are removed by using, for example, a single wafer type wet-etching apparatus, so that a fresh silicon surface is exposed at the front surface of the silicon wafer 101. In the process of FIG. 9P, the silicon oxide film 106D is also affected by the wet-etching. However, due to the silicon oxide film 106D being formed with a film thickness no less than 200 nm and having an improved HF resistance (as described in the thermal process of FIG. 9H), the silicon oxide film 106D can continue to cover the back surface of the silicon wafer 101 without being removed by the wet-etching process performed in FIG. 9P.

Figure 9Q:
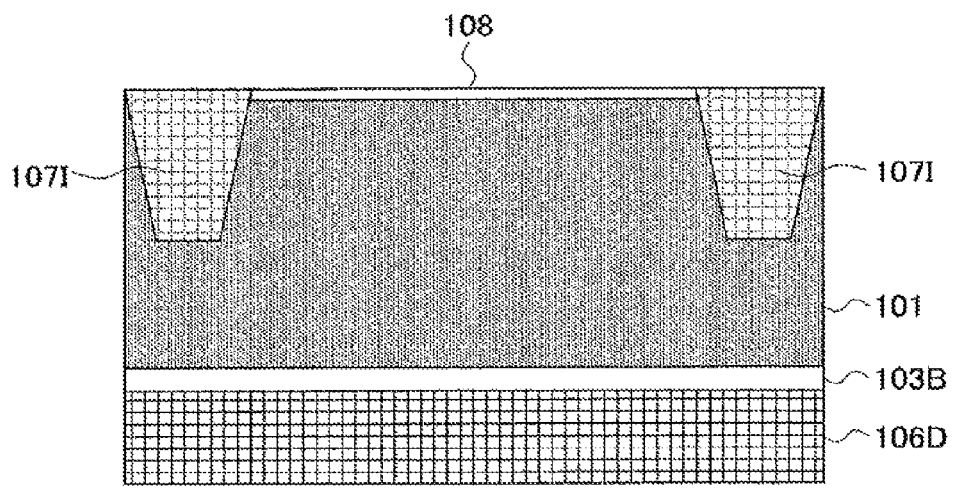

Then, the silicon wafer 101 having a configuration illustrated in FIG. 9Q is placed inside a fifth vertical furnace having substantially the same configuration as the vertical furnace 10 and is maintained with a substrate temperature e.g., 750-900° C. inside the fifth vertical furnace. Further, by guiding an oxygen gas at a flow rate of 10-20 sLm, a thermal oxide film 108 is formed on the exposed upper surface (front surface) of the silicon wafer 21. The thermal oxide film 108 is formed to have a target film thickness of approximately 1.7 nm. The thermal oxide film 108 serves as a gate insulating film of a semiconductor device.

In forming the thermal oxide film 108, can be prevented from evaporating from the back surface of the silicon wafer 101 because the back surface of the silicon wafer 101 is covered by the silicon oxide layer 106D. Thus, evaporated Si can be prevented from adhering to parts (e.g., temperature sensor) of the fifth vertical furnace. As a result, temperature control or process control can be prevented from being adversely affected by the evaporated Si.

Figure 9R:
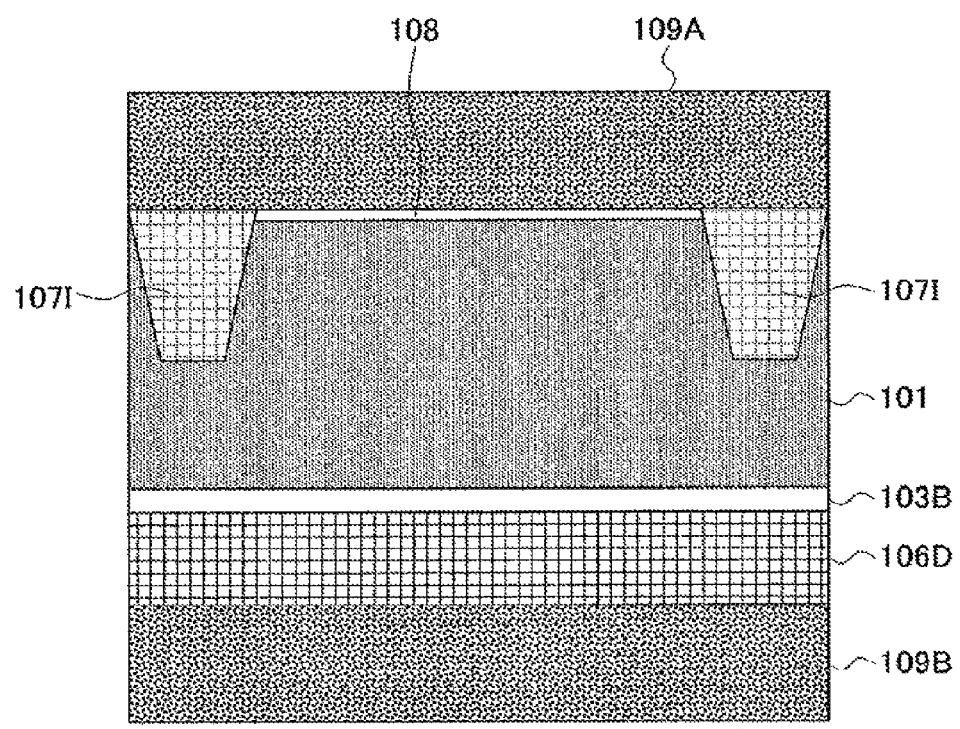

Then, the silicon wafer 101 having a configuration illustrated in FIG. 9Q is placed inside a sixth vertical furnace having substantially the same configuration as the vertical furnace 10. By supplying a silane gas is supplied into the sixth vertical furnace and performing a CVD method on the silicon wafer 101, a poly-silicon film 109A is formed on the thermal oxide film 108 with a film thickness of, for example, 100 nm (as illustrated in FIG. 9R). At the same time of forming the poly-silicon film 109A, a poly-silicon film 109B having the same film thickness as the poly-silicon film 109A is formed at the back surface of the silicon wafer 101.

Then, the silicon wafer 101 having a configuration illustrated in FIG. 9R is removed from the sixth vertical furnace.

Figure 9S:
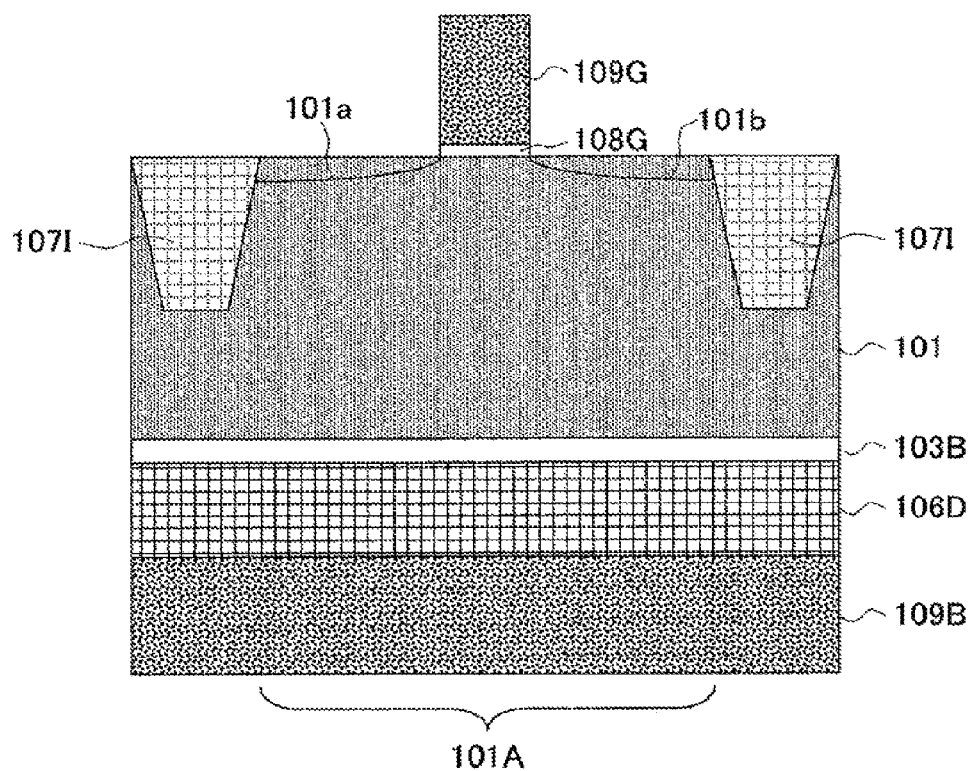

Then, the poly-silicon film 109A and the thermal oxide film 108 provided below the poly-silicon film 109A are patterned by using resist on the silicon wafer 101. Thereby, a poly-silicon gate electrode 109G and a gate insulating film 108G are formed on the silicon wafer 101 as illustrated in FIG. 9S. Then, by using the poly-silicon gate electrode 109G as a mask, a p-type or n-type impurity element is implanted (ion implantation) into the silicon wafer 101. Thereby, diffusion regions 101a, 101b are formed in a device region 101A separated (delineated) by device separating regions 107I at the front surface of the silicon wafer 101. The diffusion regions 101a, 101b serve as LDDs (Lightly Doped Drains).

Then, the silicon wafer 101 having a configuration illustrated in FIG. 9S is placed inside a seventh vertical furnace having substantially the same configuration as the vertical furnace 10. By introducing ammonia ($NH_3$) and silane gas into the seventh vertical furnace and performing a CVD method on the front surface of the silicon wafer 101, a silicon nitride film 110A is formed in a manner covering the poly-silicon gate electrode 109G. At the same time of forming the silicon nitride film 110A, another silicon nitride film 110B is formed in a manner covering the back surface of the silicon wafer 101.

Figure 9T:
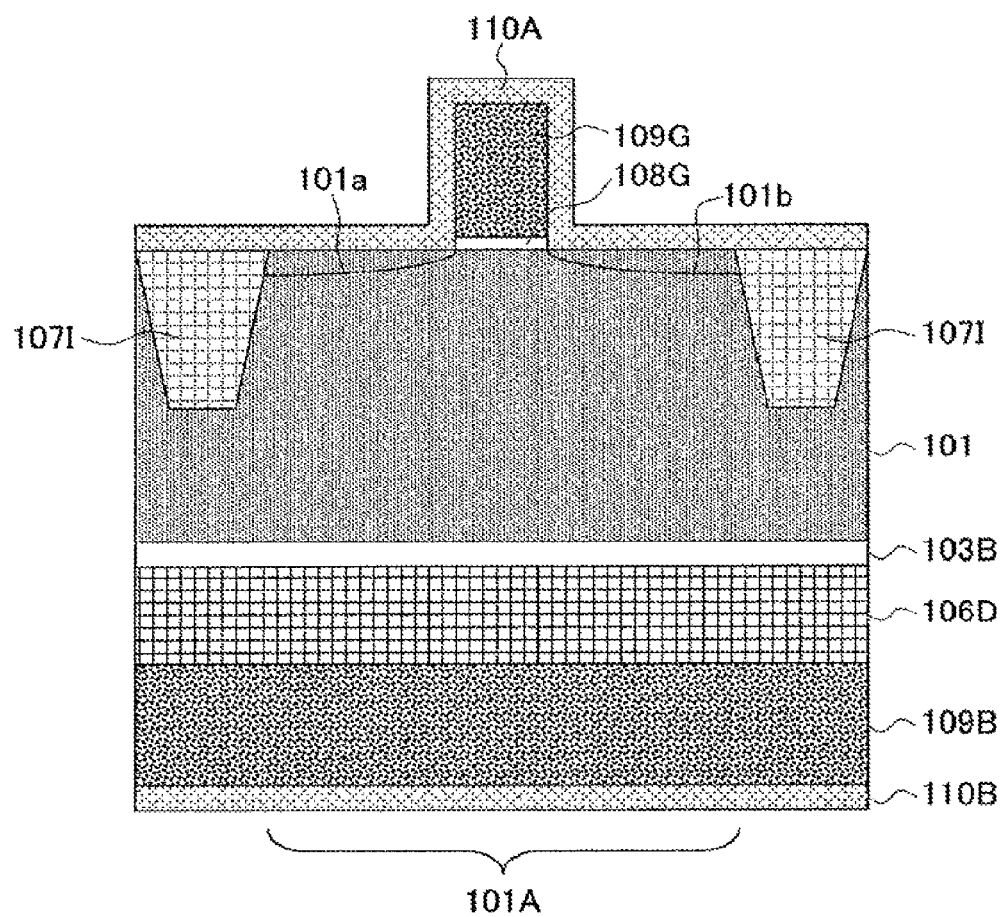

Then, the silicon wafer 101 having a configuration illustrated in FIG. 9T is removed from the seventh vertical furnace and is subject to an anisotropic etching with respect to a direction orthogonal to the front surface of the silicon wafer 101. Accordingly, the silicon nitride film 110A is etched-back, to thereby form a side wall insulating film 110W on both walls of the gate electrode 109G. Then, by using the gate electrode 109G and the side wall insulating films 110W as a mask, a p-type or n-type impurity element is implanted (ion implantation) into the silicon wafer 101. Thereby, diffusion regions 101c, 101d are formed in the device region 101A inside the silicon wafer 101. The diffusion regions 101c, 101d serve as a source, region and a drain region at the outer sides of the side wall insulating film 110W.

Figure 9U:
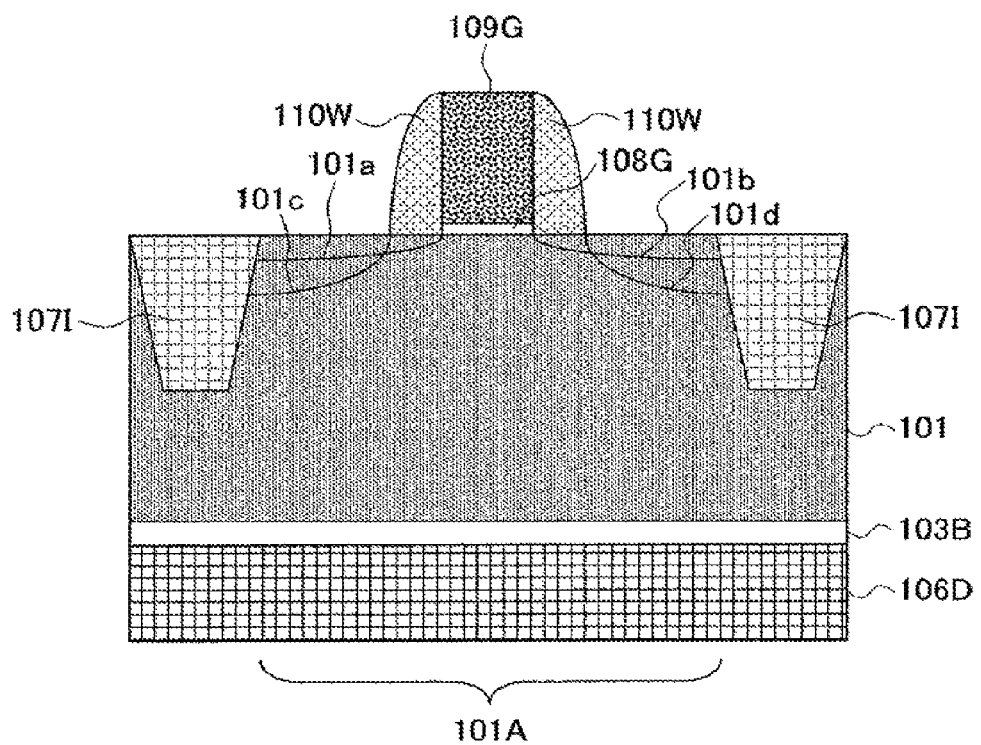

Then, in the step illustrated in FIG. 9U, the silicon nitride film 110B and the poly-silicon film 109B formed on the back surface of the silicon wafer 101 are removed. In this embodiment, the silicon nitride film 110B may be, e.g., dry-etched by using CHF etching gas and the poly-silicon film 109B is wet-etched by using an $HF/HNO_3$ etchant. Even in the state illustrated in FIG. 9U, the back surface of the silicon wafer 101 remains covered by the oxide film 106D.

Figure 9V:
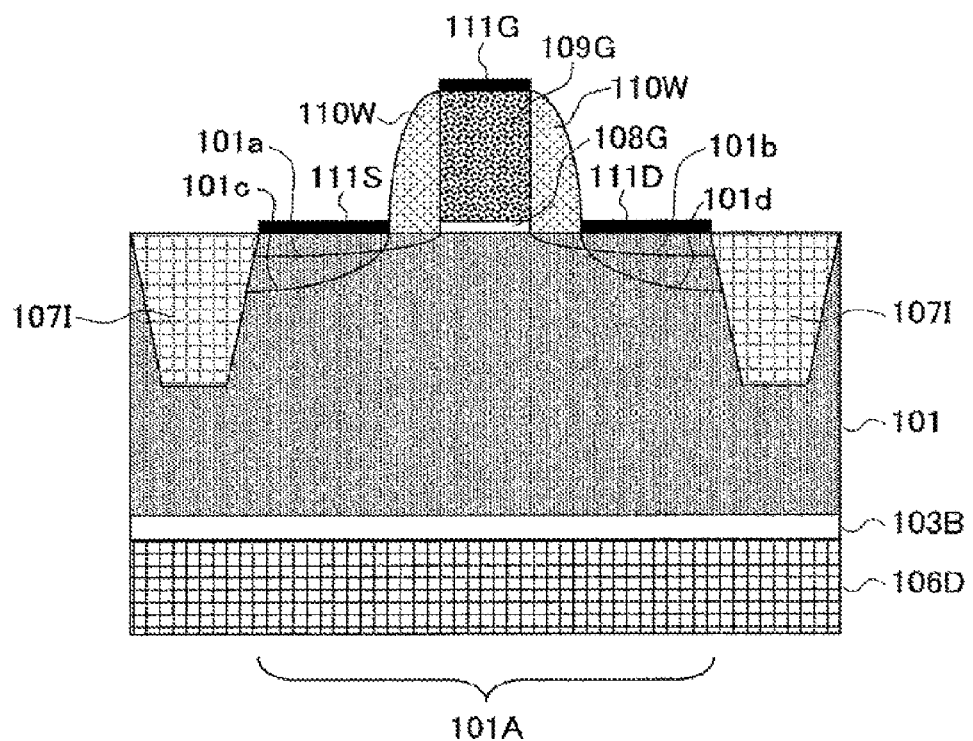

Then, as illustrated in FIG. 9V, silicide regions 111S, 111D, and 111G are formed on the corresponding diffusion regions 1011c, 1011d, and the gate electrode 109G by using, for example, a typical salicide method.

Figure 9W:
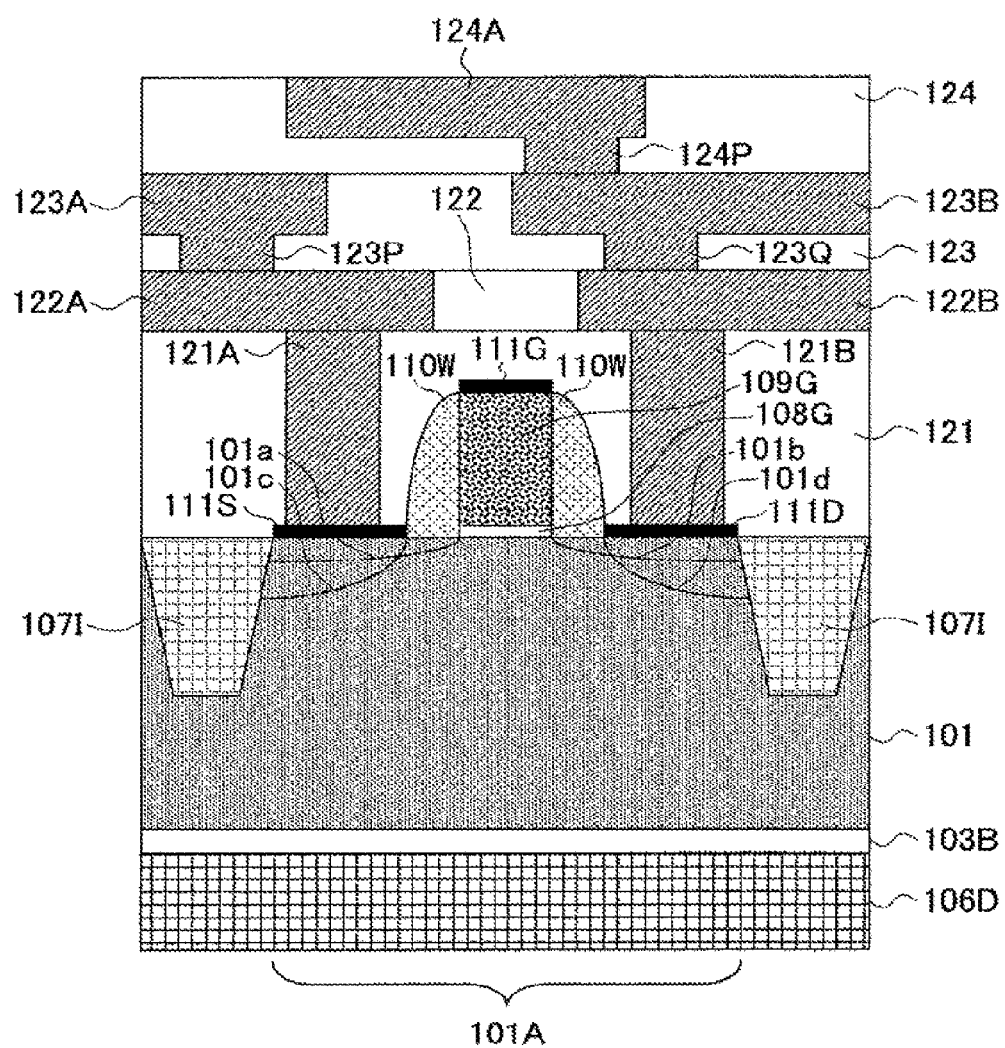

Then, as illustrated in FIG. 9W, an insulating film 121 is formed on the configuration illustrated in FIG. 9V in a manner covering the gate electrode 109G. Further, conductive plugs 121A, 121B (e.g., formed of tungsten (W)) that contact the silicide regions 111S, 111D are formed inside the insulating film 121.

Further, an interlayer insulating film 122 is formed on the insulating film 121. Further, copper (Cu) wiring patterns 122A, 122B that contact the conductive plugs are formed inside the interlayer insulating film 122 by using, for example, a damascene method.

Further, another interlayer insulating film 123 is formed on the insulating film 122. Further, a Cu wiring pattern 123A including a via plug 123P is formed inside the interlayer insulating film 123 and in contact with the Cu wiring pattern 122A by using, for example, a dual damascene method. Further, a Cu wiring pattern 123B including a via plug 123Q is formed inside the interlayer insulating film 123 and in contact with the Cu wiring pattern 123B by using, for example, a dual damascene method.

Further, another interlayer insulating film 124 is formed on the insulating film 123. Further, a Cu wiring pattern 124A including a via plug 124P is formed inside the interlayer insulating film 124 and in contact with the Cu wiring pattern 123B by using, for example, a dual damascene method.

Thus, the above-described interlayer insulating films 122-124, the Cu wiring patterns 122A, 122B, 123A, 123B, 124A, and the Cu via plugs 123P, 123Q, 124P form a multilayer wiring structure on the front surface of the silicon substrate 101.

According to the-above described second embodiment, Cu atoms do not accumulate even when forming the multilayered wiring structure because the back surface of the silicon wafer 101 is covered by the silicon oxide film 106D.

Although the first-seventh vertical furnaces used in the second embodiment have substantially the same configuration as the vertical furnace 10 illustrated in FIG. 1, the first-seventh vertical furnaces do not have to correspond (1:1) to the vertical furnaces of the first embodiment. For example, a part of or all of the first-seventh furnaces used in the second embodiment may be the same.

FIG. 10 is a flowchart illustrating processes (including the steps illustrated with FIGS. 9A-9W) for manufacturing a semiconductor device according to the second embodiment.

With reference to FIG. 10, Step S21 corresponds to the process described with FIG. 9A where the silicon wafer 101 is prepared having no oxide film or having an oxide film with a film thickness no greater than 100 nm.

Step S22 corresponds to the processes described with FIGS. 9B and 9D where the poly-silicon film 104A, which is to be used as a hard mask in a subsequent process of forming a device separating structure, is formed along with forming another poly-silicon film 104B on the back surface of the silicon wafer 101. Then, the poly-silicon film 104B is removed from the back surface of the silicon wafer 101.

Step S23 corresponds to the processes described with FIGS. 9E-9H where the silicon oxide films 105A, 105B are formed with a film thickness no less than 200 nm in a manner covering the front and back surfaces of the silicon wafer 101. Then, the silicon oxide film 105A is removed from the front surface of the silicon wafer 101. Further, the silicon oxide film 105B on the back surface of the silicon wafer 101 is thermally processed and transformed to the silicon oxide film 106D having an improved HF resistance.

Step S24 corresponds to the processes described with FIGS. 9I through 9P where the poly-silicon wafer 104A is shaped (patterned) into a hard mask pattern corresponding to device separating regions and forming separating insulating regions (device separating insulating films) 107I by filling the device separating grooves 101T formed on the front surface of the silicon wafer 101.

Step S25 corresponds to the processes described with FIGS. 9Q through 9S where the thermal oxide film 108, which is to be a gate insulating film, is formed on the front surface of the silicon wafer 101. Then, the poly-silicon film 109 is formed on the thermal oxide film 108. Further, the gate insulating film 108G and the gate electrode 109G are formed by patterning the poly-silicon 109 and the thermal oxide film 108. As described above, the back surface of the silicon wafer 101 is covered by the silicon oxide film 106D. Therefore, even in the step of forming the thermal oxide film 108, Si atoms can be prevented from evaporating from the exposed back surface of the silicon wafer 101. Thus, the vertical furnace used for forming the thermal oxide film 108 can control temperature without irregularity.

Steps S26 and S27 correspond to the processes described with FIGS. 9T and 9U. That is, the silicon nitride films 110A and 110B are formed on the front and back surfaces of the silicon wafer 101. Further, the side wall insulating films 110W are formed on both side walls of the gate electrode 109G by etching-back the silicon nitride film 110A formed on the front surface of the silicon wafer 101. Then, the silicon nitride film 110B and the poly-silicon film 29B are removed from the back surface of the silicon wafer 101.

Step S28 corresponds to the process described with FIG. 9V where the silicide layers 111S, 111D, 111G are formed on corresponding front surfaces of the diffusion regions 101c, 101d, and the gate electrode 109G.

Step S29 corresponds to the processes of forming the insulating film 121 and the via plugs 121A, 121B as described with FIG. 9W.

Steps S30-S31 correspond to the process of forming the multilayer wiring structure as described with FIG. 2W.

Thus, as described above, with the semiconductor device manufacturing method according to the second embodiment, the silicon oxide film 106D formed on the back surface of the silicon wafer 101 remains until the end of the final Step S30. As a result, even in the process of forming the multilayer wiring structure including a Cu deposition step using an electrolytic-plating method, the back surface of the silicon wafer 101 can be prevented from being contaminated by Cu.

Further, according to this embodiment, the film which covers the back surface of the silicon wafer 101 from beginning to end of the semiconductor device manufacturing method is a silicon oxide film. Thus, unlike with a nitride film, with a silicon oxide film, the silicon wafer 101 can be easily removed from an electrostatic chuck without being affected by residual charges.

Although the semiconductor device manufacturing method according to the second embodiment is performed using separate first-sixth vertical furnaces, a part of or all of the first-sixth furnaces may be the same.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A method for manufacturing a semiconductor device, comprising:
    forming a substrate having first and second surfaces, the substrate including no oxide film or an oxide film having a thickness no greater than 100 nm;
    forming a first film by covering at least the first surface;
    forming a first oxide film on the first and second surfaces;
    removing the first oxide film formed on the first surface;
    forming a mask pattern on the first surface by patterning the first film;
    forming a device separating region on the first surface by using the mask pattern as a mask;
    forming a gate insulating film on the first surface;
    forming a gate electrode on the first surface via the gate insulating film;

forming a source and a drain on each side of the gate electrode; and forming a wiring layer on the substrate while leaving the first oxide film on the second surface.

2. The method as claimed in claim 1, wherein forming the gate insulating film is performed by placing a plurality of the substrates in a vertical furnace and thermally processing the plurality of the substrates.

3. The method as claimed in claim 2, wherein the thermal processing is performed subsequent to the removing of the first oxide film.

4. The method as claimed in claim 1, wherein forming the device separating region includes forming a device separating groove on the first surface by using the mask pattern;

depositing a silicon oxide film on the first surface; and removing the silicon oxide film except at an area of the first surface where the device separating groove is formed;

wherein the silicon oxide film is removed by using a chemical mechanical polishing process and a HydroFluoric (HF) process.

5. The method as claimed in claim 1, wherein the first film is a single layer film including a poly-silicon film.

6. The method as claimed in claim 1, wherein the first oxide film has a thickness no less than 200 nm.

7. The method as claimed in claim 1, wherein forming the wiring layer includes forming a Cu wiring layer.

8. The method as claimed in claim 1, wherein the first film is a single layer film including a silicon oxide film.

9. The method as claimed in claim 1, wherein the first film is a single layer film including a silicon nitride film or a silicon oxynitride film.

10. The method as claimed in claim 1, wherein the first film is a single layer film including an amorphous silicon film.

11. The method as claimed in claim 1, wherein the first film is a multilayer film including two or more of a poly-silicon film, a silicon oxide film, a silicon nitride film, an amorphous silicon film, and a silicon oxynitride film.

12. The method as claimed in claim 1, wherein the substrate is a silicon substrate.

13. The method as claimed in claim 1, wherein the substrate is a 300 mm wafer.

14. The method as claimed in claim 1, wherein a size of the substrate is that of a 300mm wafer.

15. The method as claimed in claim 1, wherein the wiring layer includes a multilayered wiring structure.

* * * * *